US011158456B2

(12) United States Patent
Masuda et al.

(10) Patent No.: US 11,158,456 B2
(45) Date of Patent: Oct. 26, 2021

(54) TRENCH CAPACITOR

(71) Applicant: TAIYO YUDEN CO., LTD., Tokyo (JP)

(72) Inventors: Hidetoshi Masuda, Tokyo (JP); Yoshinari Take, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 90 days.

(21) Appl. No.: 16/451,691

(22) Filed: Jun. 25, 2019

(65) Prior Publication Data
US 2020/0005999 A1  Jan. 2, 2020

(30) Foreign Application Priority Data
Jun. 27, 2018  (JP) .............................. JP2018-122277

(51) Int. Cl.
*H01G 4/12* (2006.01)
*H05K 1/18* (2006.01)
*H01G 4/005* (2006.01)

(52) U.S. Cl.
CPC .............. *H01G 4/12* (2013.01); *H01G 4/005* (2013.01); *H05K 1/18* (2013.01); *H05K 2201/10015* (2013.01)

(58) Field of Classification Search
CPC ............ H01G 4/12; H01G 4/005; H01G 4/10; H01G 4/01; H01G 28/60; H05K 1/18; H05K 2201/10015
See application file for complete search history.

(56) References Cited

U.S. PATENT DOCUMENTS

| | | |
|---|---|---|
| 2008/0237794 A1 | 10/2008 | Shoji |
| 2008/0291601 A1 | 11/2008 | Roozeboom et al. |
| 2008/0291603 A1 | 11/2008 | Matters-Kammerer |
| 2009/0185317 A1 | 7/2009 | Dijkhuis et al. |
| 2009/0244808 A1 | 10/2009 | Ohtsuka et al. |
| 2010/0230787 A1 | 9/2010 | Guiraud et al. |
| 2010/0244189 A1 | 9/2010 | Klootwijk et al. |
| 2010/0316911 A1 | 12/2010 | Tesson et al. |
| 2012/0146182 A1 | 7/2012 | Oganesian et al. |
| 2014/0145299 A1 | 5/2014 | Kalnitsky et al. |
| 2016/0020267 A1 | 1/2016 | Lin |
| 2016/0233217 A1* | 8/2016 | Brain .................. H01L 23/5226 |

(Continued)

FOREIGN PATENT DOCUMENTS

| | | |
|---|---|---|
| JP | 2008-251724 A | 10/2008 |
| JP | 2008-251725 A | 10/2008 |

(Continued)

*Primary Examiner* — Michael P McFadden
(74) *Attorney, Agent, or Firm* — Pillsbury Winthrop Shaw Pittman, LLP

(57) ABSTRACT

A trench capacitor according to one embodiment of the present invention includes a base member with an upper surface having a plurality of trenches provided therein and an MIM structure provided on the base member so as to be embedded in the plurality of trenches. In the embodiment, the plurality of trenches include a first trench and a second trench adjacent to the first trench in a first direction orthogonal to a depth direction of the plurality of trenches. The base member includes a first wall separating the first trench from the second trench. The first wall includes a first portion having an acute angle at a distal end thereof in a section including the first direction and the depth direction.

13 Claims, 19 Drawing Sheets

(56) References Cited

U.S. PATENT DOCUMENTS

| | | | |
|---|---|---|---|
| 2016/0268144 A1 | 9/2016 | Voiron et al. | |
| 2016/0284694 A1* | 9/2016 | Chou et al. | |
| 2018/0151666 A1* | 5/2018 | Yew | H01L 28/91 |
| 2018/0308638 A1* | 10/2018 | Ryou | H01G 4/33 |
| 2018/0315550 A1* | 11/2018 | Ryou | H01G 2/06 |

FOREIGN PATENT DOCUMENTS

| | | | |
|---|---|---|---|
| JP | 2008-251728 A | 10/2008 |
| JP | 2008-251972 A | 10/2008 |
| JP | 2009-515353 A | 4/2009 |
| JP | 2009-515356 A | 4/2009 |
| JP | 2009-135310 A | 6/2009 |
| JP | 2009-135311 A | 6/2009 |
| JP | 2009-246180 A | 10/2009 |
| JP | 2009-535835 A | 10/2009 |
| JP | 2009-541984 A | 11/2009 |
| JP | 2009-295925 A | 12/2009 |
| JP | 2010-045297 A | 2/2010 |
| JP | 2010-530128 A | 9/2010 |
| JP | 2011-503841 A | 1/2011 |
| JP | 2013-141003 A | 7/2013 |
| JP | 2014-505354 A | 2/2014 |
| JP | 2016-009863 A | 1/2016 |
| JP | 2016-157946 A | 9/2016 |
| JP | 2016-195160 A | 11/2016 |
| JP | 2016-195161 A | 11/2016 |
| JP | 2016-195164 A | 11/2016 |
| JP | 2016-535441 A | 11/2016 |

* cited by examiner

TRENCH CAPACITOR

CROSS-REFERENCE TO RELATED APPLICATIONS

This application is based on and claims the benefit of priority from Japanese Patent Application Serial No. 2018-122277 (filed on Jun. 27, 2018), the contents of which are hereby incorporated by reference in their entirety.

TECHNICAL FIELD

The present disclosure relates to a trench capacitor. More specifically, the present disclosure relates to a trench capacitor configured so that its failure mode is an open mode.

BACKGROUND

Conventionally, there is known a trench capacitor that can be improved in capacitance per unit area. In such a trench capacitor, trenches are formed in a base member, and a MIM (metal-insulator-metal) structure for generating a capacitance is embedded in the trenches. The MIM structure is a laminate composed of a dielectric layer and an electrode layer alternately stacked on each other, the dielectric layer being formed of a dielectric, the electrode layer being formed of a conductor. In the trench capacitor, the dielectric layer and a conductor layer are provided also on side surfaces of the trenches extending in a thickness direction of the base member, and thus a capacitance per unit area can be improved.

Conventional trench capacitors are disclosed in, for example, Japanese Patent Application Publication No. 2008-251724, Japanese Patent Application Publication No. 2008-251725, Japanese Patent Application Publication No. 2008-251728, Japanese Patent Application Publication No. 2008-251972, Japanese Patent Application Publication No. 2009-135310, Japanese Patent Application Publication No. 2009-135311, Japanese Patent Application Publication (Translation of PCT Application) No. 2009-515353, Japanese Patent Application Publication (Translation of PCT Application) No. 2009-515356, Japanese Patent Application Publication (Translation of PCT Application) No. 2009-535835, Japanese Patent Application Publication No. 2009-246180, Japanese Patent Application Publication No. 2009-295925, Japanese Patent Application Publication (Translation of PCT Application) No. 2009-541984, Japanese Patent Application Publication No. 2010-045297, Japanese Patent Application Publication (Translation of PCT Application) No. 2010-530128, Japanese Patent Application Publication (Translation of PCT Application) No. 2011-503841, Japanese Patent Application Publication No. 2013-141003, Japanese Patent Application Publication (Translation of PCT Application) No. 2014-505354, Japanese Patent Application Publication No. 2016-009863, Japanese Patent Application Publication No. 2016-157946, Japanese Patent Application Publication No. 2016-195160, Japanese Patent Application Publication No. 2016-195161, Japanese Patent Application Publication No. 2016-195164, Japanese Patent Application Publication (Translation of PCT Application) No. 2016-535441, Specification of U.S. Patent Application Publication No. 2016/0020267, Specification of U.S. Patent Application Publication No. 2016/0284694, and Specification of U.S. Patent Application Publication No. 2014/0145299.

In the trench capacitor, dielectric breakdown might occur in the dielectric layer interposed between the electrode layers. For example, in a case where a manufacturing defect or a deterioration has occurred in the dielectric layer, dielectric breakdown is likely to occur at where the defect or deterioration is located. Upon occurrence of the dielectric breakdown in the dielectric layer, Joule's heat is generated by an electric current flowing through a broken-down area of the dielectric layer and melts part of the electrode layers. The molten part of the electrode layers flows around the broken-down area. The flowing molten part of the electrode layers causes a short circuit between the electrode layers provided on both surfaces of the dielectric layer, so that a normal failure mode in the trench capacitor is a short circuit mode.

In the trench capacitor, when a failure occurs in the short circuit mode, an electric current might be applied to a constituent component of a circuit connected to the trench capacitor, the electric current not being supposed to be applied thereto. Such application of an unintended electric current might lead to a malfunction or breakage of the circuit. In the trench capacitor, a failure mode desirable for preventing such application of an unwanted electric current to another circuit is an open mode.

As mentioned above, numerous patent applications related to trench capacitors have been filed. Nevertheless, so far, there is known no trench capacitor capable of inducing a failure mode to be an open mode, the failure mode being attributable to dielectric breakdown in a dielectric layer.

SUMMARY

One object of the present disclosure is to provide a trench capacitor capable of inducing a failure mode to be an open mode, the failure mode representing a failure caused by dielectric breakdown in a dielectric layer. Other objects of the present disclosure will be made apparent through the entire description herein.

A trench capacitor according to one embodiment of the present invention includes a base member with an upper surface having a plurality of trenches provided therein and an MIM structure provided on the base member so as to be embedded in the plurality of trenches. In the embodiment, the plurality of trenches include a first trench and a second trench adjacent to the first trench in a first direction orthogonal to a depth direction of the plurality of trenches. The base member includes a first wall separating the first trench from the second trench. The first wall includes a first portion having an acute angle at a distal end thereof in a section including the first direction and the depth direction.

In the trench capacitor according to one embodiment of the present invention, the first wall is formed so that the distal end of the first portion has a distal end curvature radius of 50 nm or less.

In the trench capacitor according to one embodiment of the present invention, the first portion of the first wall has a first inclined surface inclined at a first angle with respect to the depth direction and a second inclined surface inclined at a second angle with respect to the depth direction, the second inclined surface being connected to the first inclined surface.

In the trench capacitor according to one embodiment of the present invention, the first wall is formed so that a distal end angle formed between the first inclined surface and the second inclined surface is 2° to 240°.

In the trench capacitor according to one embodiment of the present invention, a second portion of the first wall different from the first portion includes a third inclined surface inclined at the first angle with respect to the depth direction, a fourth inclined surface inclined at the second angle with respect to the depth direction, and a first wall upper surface connecting the third inclined surface to the fourth inclined surface.

The trench capacitor according to one embodiment of the present invention further includes a protective layer provided on the MIM structure. The protective layer has a first through hole provided at a position overlapping with the first portion in plan view.

In the trench capacitor according to one embodiment of the present invention, the first through hole is formed at a position not overlapping with an external electrode in plan view.

In the trench capacitor according to one embodiment of the present invention, the MIM structure includes a first dielectric layer, a first electrode layer provided on a lower surface of the first dielectric layer, and a second electrode layer provided on an upper surface of the first dielectric layer.

In the trench capacitor according to one embodiment of the present invention, the MIM structure further includes a second dielectric layer provided on an upper surface of the second electrode layer and a third electrode layer provided on an upper surface of the second dielectric layer.

In the trench capacitor according to one embodiment of the present invention, each of the second dielectric layer and the third electrode layer has a second through hole provided at a position overlapping with the first portion in plan view.

The trench capacitor according to one embodiment of the present invention further includes a barrier layer provided between the MIM structure and the protective layer.

In the trench capacitor according to one embodiment of the present invention, the plurality of trenches further include a third trench and a fourth trench adjacent to the third trench in the first direction, and the base member further includes a second wall separating the third trench from the fourth trench. The second wall includes a fifth inclined surface inclined at the first angle with respect to the depth direction, a sixth inclined surface inclined at the second angle with respect to the depth direction, and a second wall upper surface connecting the fifth inclined surface to the sixth inclined surface.

Another embodiment of the present invention relates to a circuit board including any one of the above-described trench capacitors. Yet another embodiment of the invention relates to an electronic device including the circuit board.

Advantages

According to the present disclosure, in a trench capacitor, a failure mode can be induced to be an open mode, the failure mode being attributable to dielectric breakdown in a dielectric layer.

BRIEF DESCRIPTION OF THE DRAWINGS

FIG. 5 shows an electrical connection structure between an external electrode 2 and an MIM structure 20.

FIG. 6 shows an electrical connection structure between an external electrode 3 and the MIM structure 20.

In FIG. 7, members other than a base member are not shown.

FIG. 12A shows a plan view of the base member prepared.

FIG. 12B shows a plan view of the base member provided with walls, some of which include a first portion having a decreased width in an X-axis direction.

FIG. 13A shows an XZ section of part of the base member prepared.

FIG. 13B shows an XZ section of part of the base member provided with the walls, some of which include a narrow portion having a decreased width in the X-axis direction.

FIG. 13C shows an XZ section of part of the base member provided with the walls each including the inclined portion.

FIG. 13D shows an XZ section of part of the base member on which the MIM structure is provided.

FIG. 13E shows an XZ section of part of the base member on which the MIM structure, the barrier layer, and the protective layer are provided.

DESCRIPTION OF EXAMPLE EMBODIMENTS

The following describes various embodiments of the present invention with reference to the drawings as appropriate. Constituent elements common to a plurality of drawings are denoted by the same reference signs throughout the plurality of drawings. It should be noted that the drawings do not necessarily appear to an accurate scale for the sake of convenience of explanation.

Figure 1:
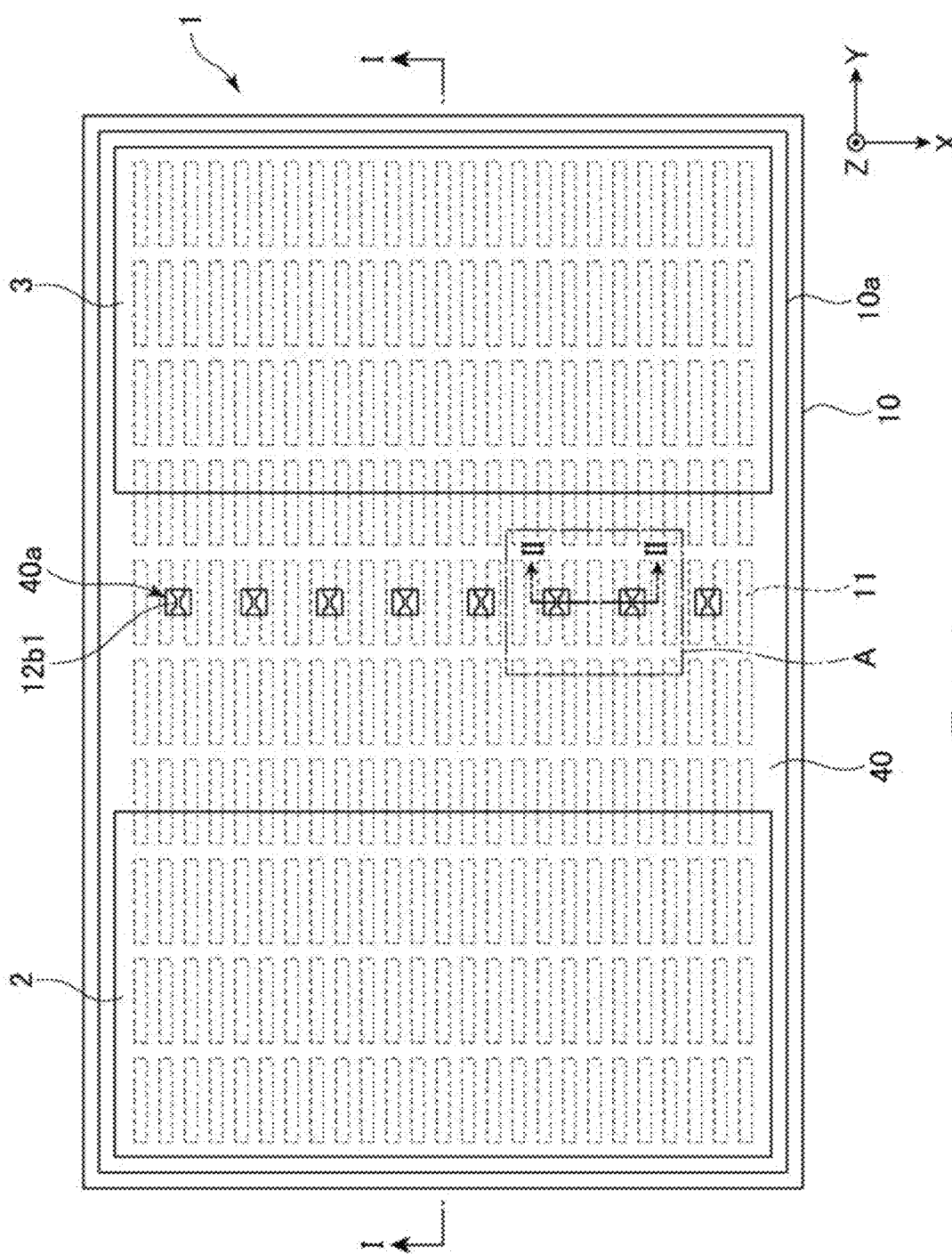
FIG. 1 is a plan view of a trench capacitor according to one embodiment of the present invention.
Figure 2:
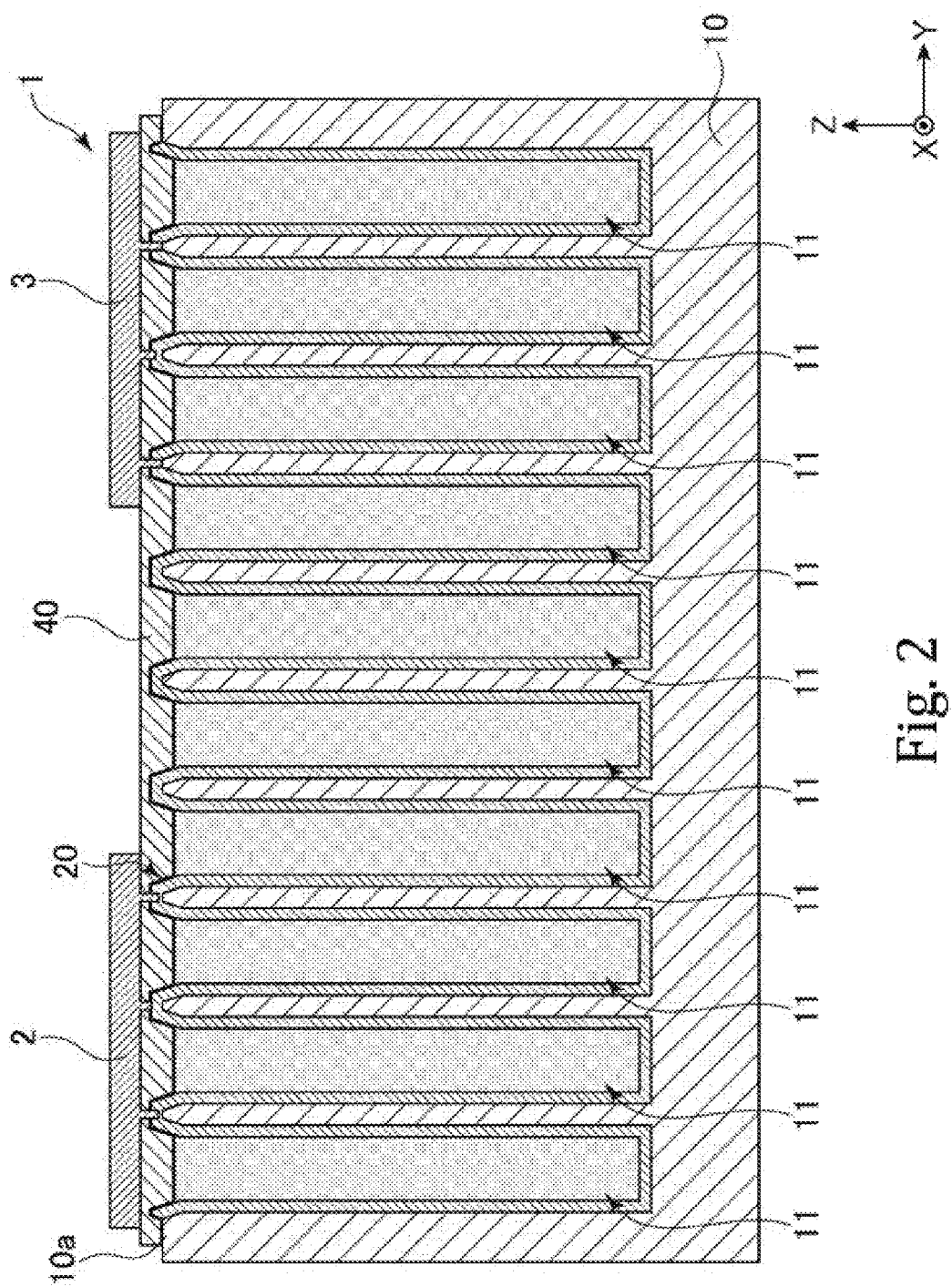
FIG. 2 is a sectional view schematically showing a YZ section of the trench capacitor shown in FIG. 1 cut along a line I-I.
Figure 3:
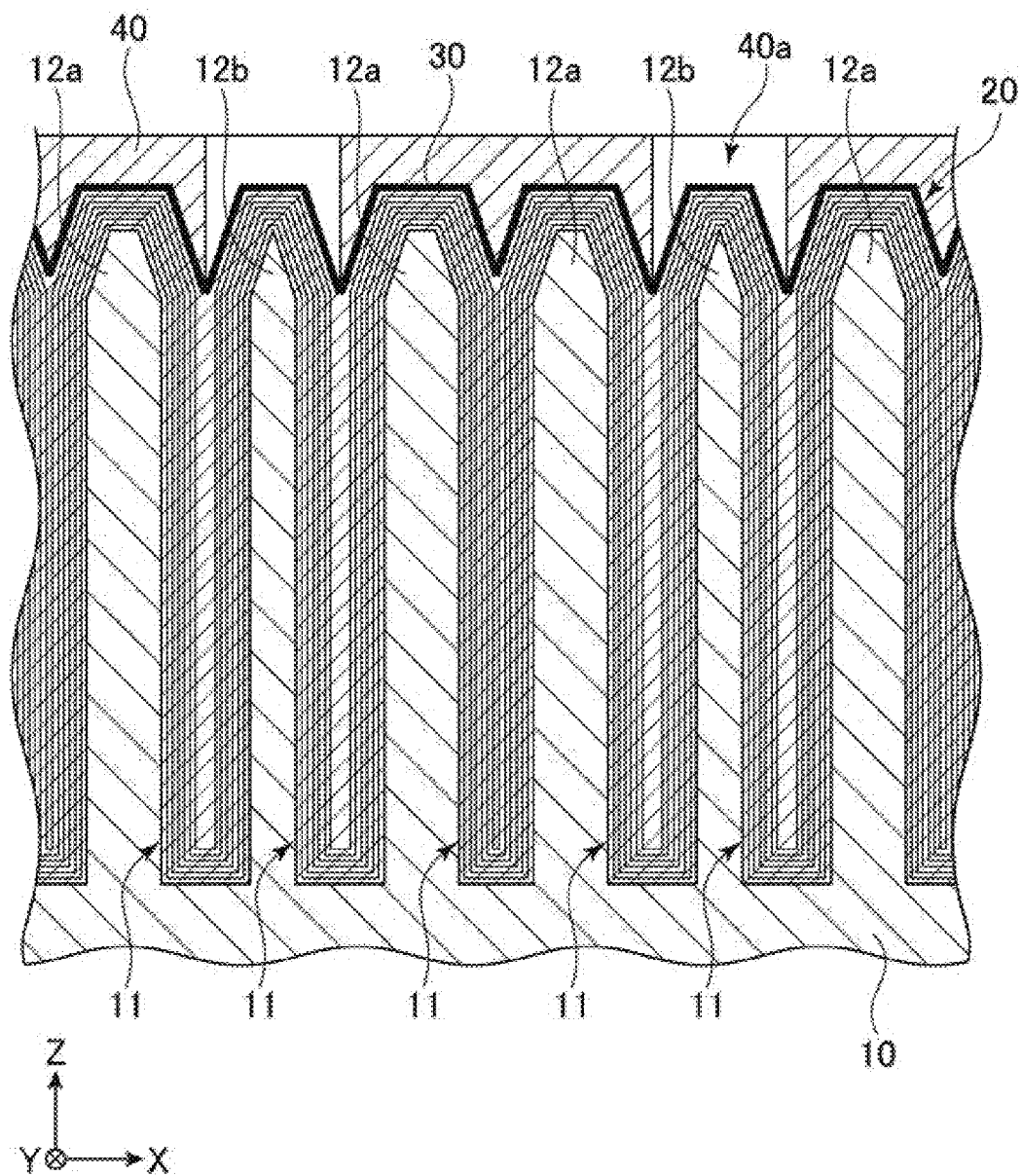
FIG. 3 is a sectional view schematically showing an XZ section of the trench capacitor shown in FIG. 1 cut along a line II-II.
Figure 4:
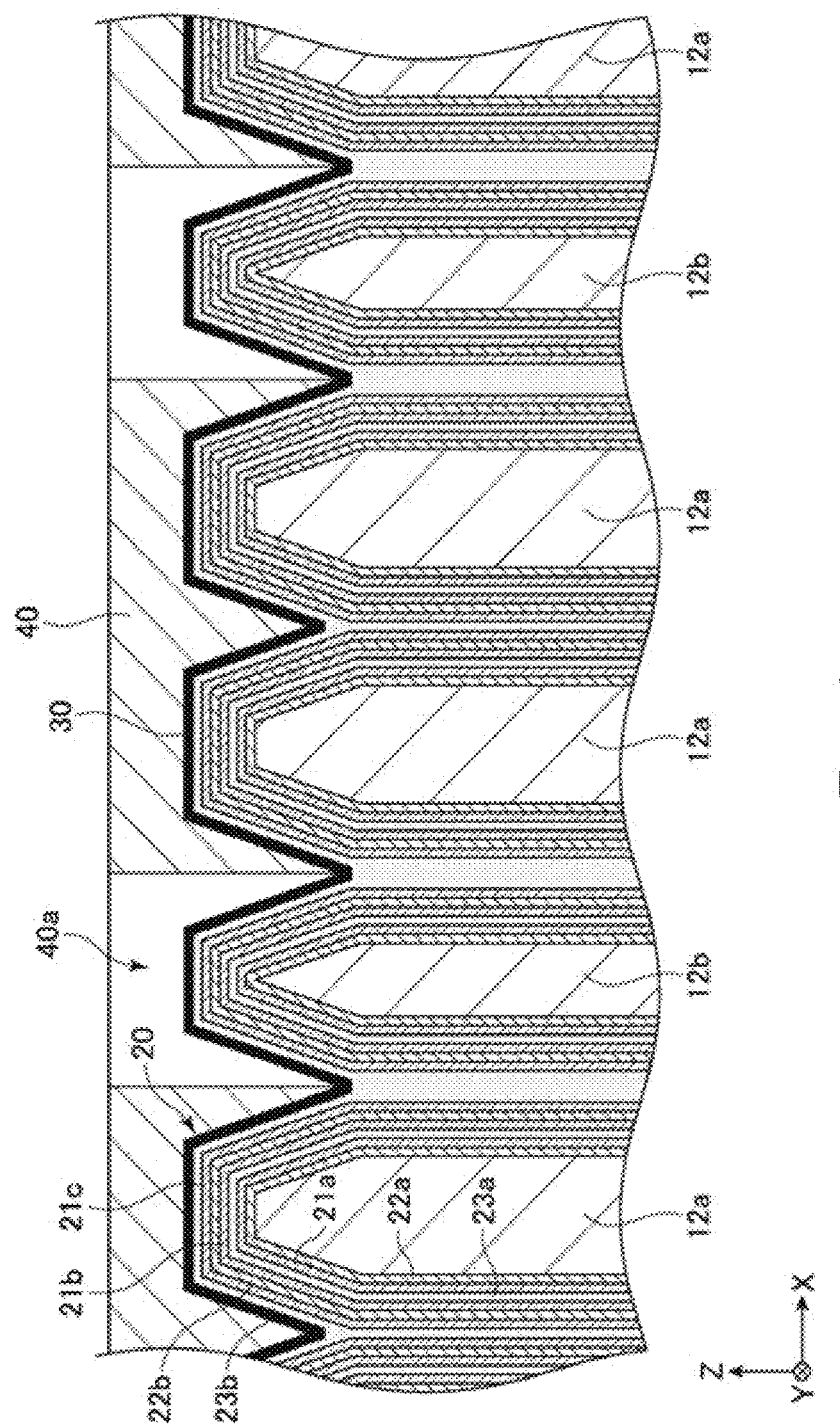
FIG. 4 is an enlarged sectional view schematically showing, in the XZ section of the trench capacitor shown in FIG. 3, a vicinity of an upper surface of the trench capacitor.
Figure 5:
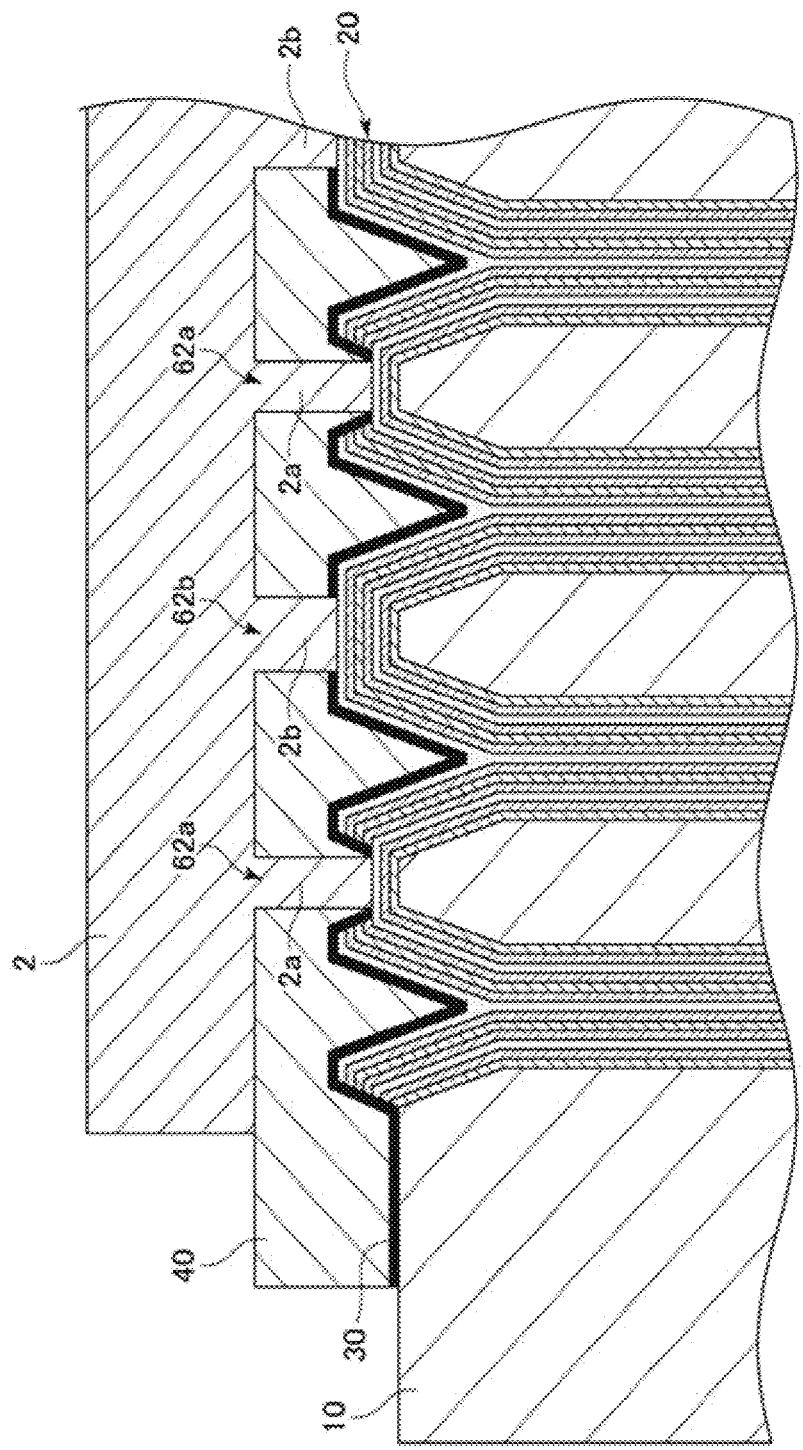
FIG. 5 is an enlarged sectional view schematically showing part of the YZ section of the trench capacitor shown in FIG. 1.
Figure 6:
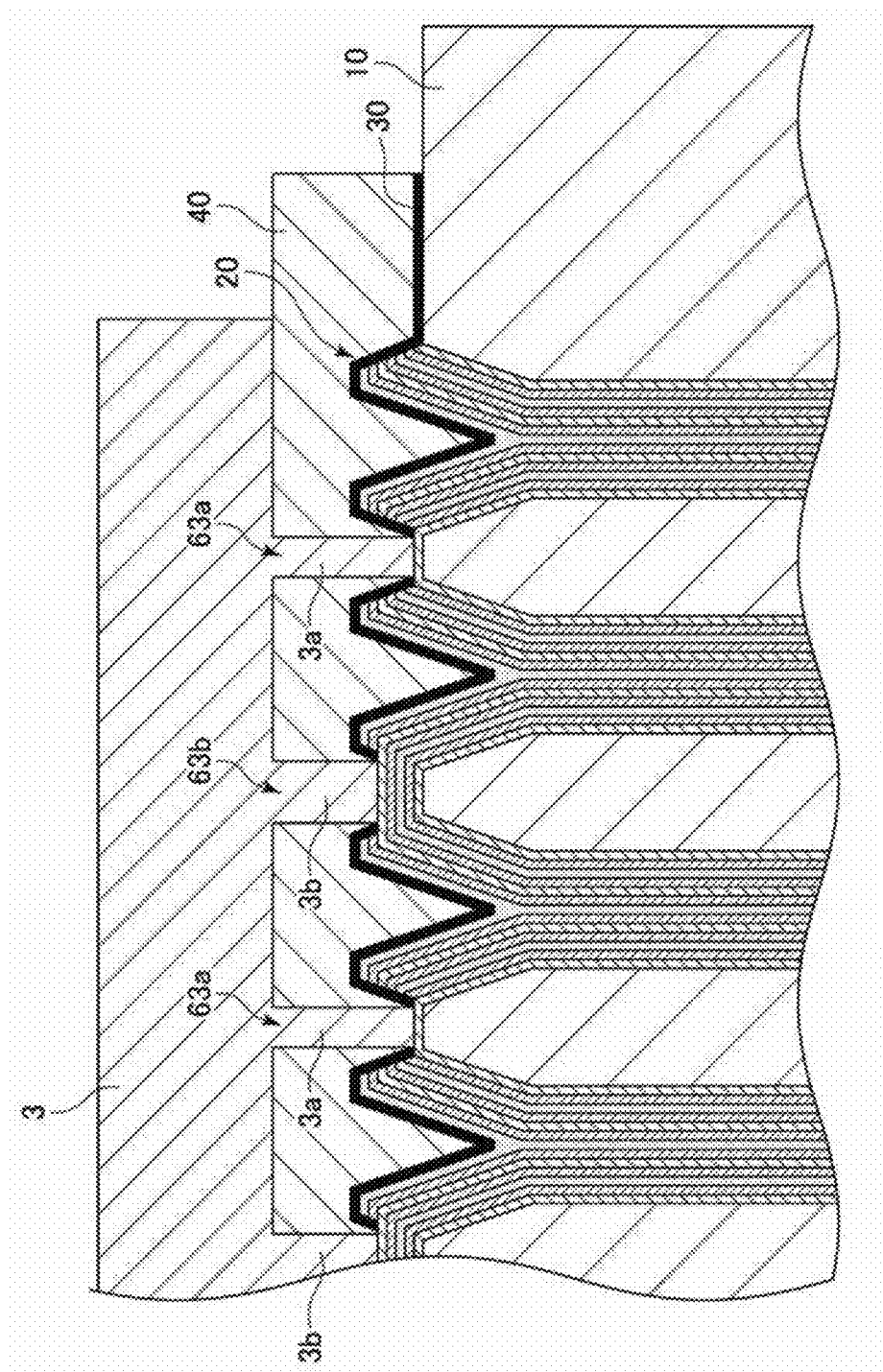
FIG. 6 is an enlarged sectional view schematically showing part of the YZ section of the trench capacitor shown in FIG. 1.

A trench capacitor 1 according to one embodiment of the present invention will now be described with reference to FIG. 1 to FIG. 6. FIG. 1 is a plan view of the trench capacitor 1, FIG. 2 is a sectional view schematically showing a section of the trench capacitor 1 cut along a line I-I, and FIG. 3 is a sectional view schematically showing a section of the trench capacitor 1 cut along a line II-II. FIG. 4 is an enlarged sectional view schematically showing a vicinity of an upper surface of the trench capacitor 1, FIG. 5 is an enlarged sectional view schematically showing a vicinity of an external electrode 2 in the trench capacitor 1, and FIG. 6 is an enlarged sectional view schematically showing a vicinity of an external electrode 3 in the trench capacitor 1.

As shown, the trench capacitor 1 according to one embodiment includes a base member 10, an MIM structure 20 provided on the base member 10, a barrier layer 30 provided on the MIM structure 20, and a protective layer 40 provided on the barrier layer 30. The protective layer 40 is provided so as to cover the MIM structure 20 and the barrier layer 30 provided on the MIM structure 20. The barrier layer 30 is provided between the MIM structure 20 and the protective layer 40. An external electrode 2 and an external electrode 3 are provided on the protective layer 40. The external electrode 2 is electrically connected to a positive internal electrode layer 23 of the MIM structure 20, which will be described later, and the external electrode 3 is electrically connected to a negative internal electrode layer 21 of the MIM structure 20, which will be described later.

The external electrode 2 and the external electrode 3 are joined to a land provided on a circuit board, and thus the trench capacitor 1 is mounted on the circuit board. The circuit board can be incorporated in various electronic devices. Examples of an electronic device including a circuit board having the trench capacitor 1 mounted thereon include a smartphone, a mobile phone, a tablet terminal, a game console, and any other electronic device that can include a circuit board having the trench capacitor 1 mounted thereon.

The drawings including FIG. 1 show an X direction, a Y direction, and a Z direction orthogonal to one another. Herein, orientations and arrangements of constituent members of the trench capacitor 1 may be described based on the X direction, the Y direction, and the Z direction shown in FIG. 1. Specifically, a "width" direction, a "length" direction, and a "thickness" direction of the trench capacitor 1 correspond to a direction along an X axis, a direction along a Y axis, and a direction along a Z axis in FIG. 1, respectively, unless otherwise construed from the context. Herein, a top-bottom direction of the trench capacitor 1 and the constituent members thereof is based on a top-bottom direction in FIG. 1. That is, a positive direction of the Z axis is defined as an upward direction of the trench capacitor 1, and a negative direction of the Z axis is defined as a downward direction of the trench capacitor 1, unless otherwise construed from the context.

In one embodiment, the base member 10 is made of an insulating material such as Si. In one embodiment, the base member 10 is formed in a substantially rectangular parallelepiped shape and has a dimension in a width direction (an X-axis direction) of, for example, 50 μm to 5000 μm, a dimension in a length direction (a Y-axis direction) of, for example, 50 μm to 5000 μm, and a dimension in a thickness direction (a Z-axis direction) of, for example, 5 μm to 500 μm. The dimensions of the base member 10 specifically described herein are merely illustrative, and the base member 10 may have any dimensions.

The base member 10 has a plurality of trenches 11 formed to extend from an upper surface 10a of the base member 10 along the Z-axis direction. Each of the plurality of trenches 21 is formed to have a predetermined depth in the Z-axis direction. Herein, the Z-axis direction may be referred to as a depth direction of the trenches 11. As shown in FIG. 1, each of the plurality of trenches 11 is formed in a substantially rectangular shape in plan view, which is defined by a side extending along the X-axis direction and a side extending along the Y-axis direction. In the embodiment shown, each of the plurality of trenches 11 is formed so that, in plan view, the side extending along the X-axis direction is shorter than the side extending along the Y-axis direction.

In one embodiment, each of the plurality of trenches 11 is formed to have a high aspect ratio so that a higher capacitance per unit area can be obtained. That is, each of the plurality of trenches 11 is formed to have an increased ratio of its depth (its depth in the Z-axis direction) to its width (for example, a length of a side thereof in the X-axis direction). Each of the plurality of trenches 11 has a width (a dimension in the X-axis direction) of, for example, 0.1 μm to 5 μm and a depth (a dimension in the Z-axis direction) of, for example, 1 μm to 100 μm. The dimensions of each of the trenches 11 specifically described herein are merely illustrative, and each of the trenches 11 may have any dimensions. Furthermore, each of the trenches 11 is not limited in shape in plan view to a rectangular shape, and each of the trenches 11 may have any shape. In one embodiment, each of the trenches 11 is configured to have a depth (a dimension in the Z-axis direction) of 40 μm and a width (a dimension in the X-axis direction) of 1.0 μm.

The trenches 11 can be formed by, for example, forming a mask on a surface of an Si substrate, the mask having openings corresponding to a pattern of the trenches 11, and then etching the Si substrate. The Si substrate can be etched by a reactive ion etching method such as deep RIE (deep reactive etching).

Figure 7:
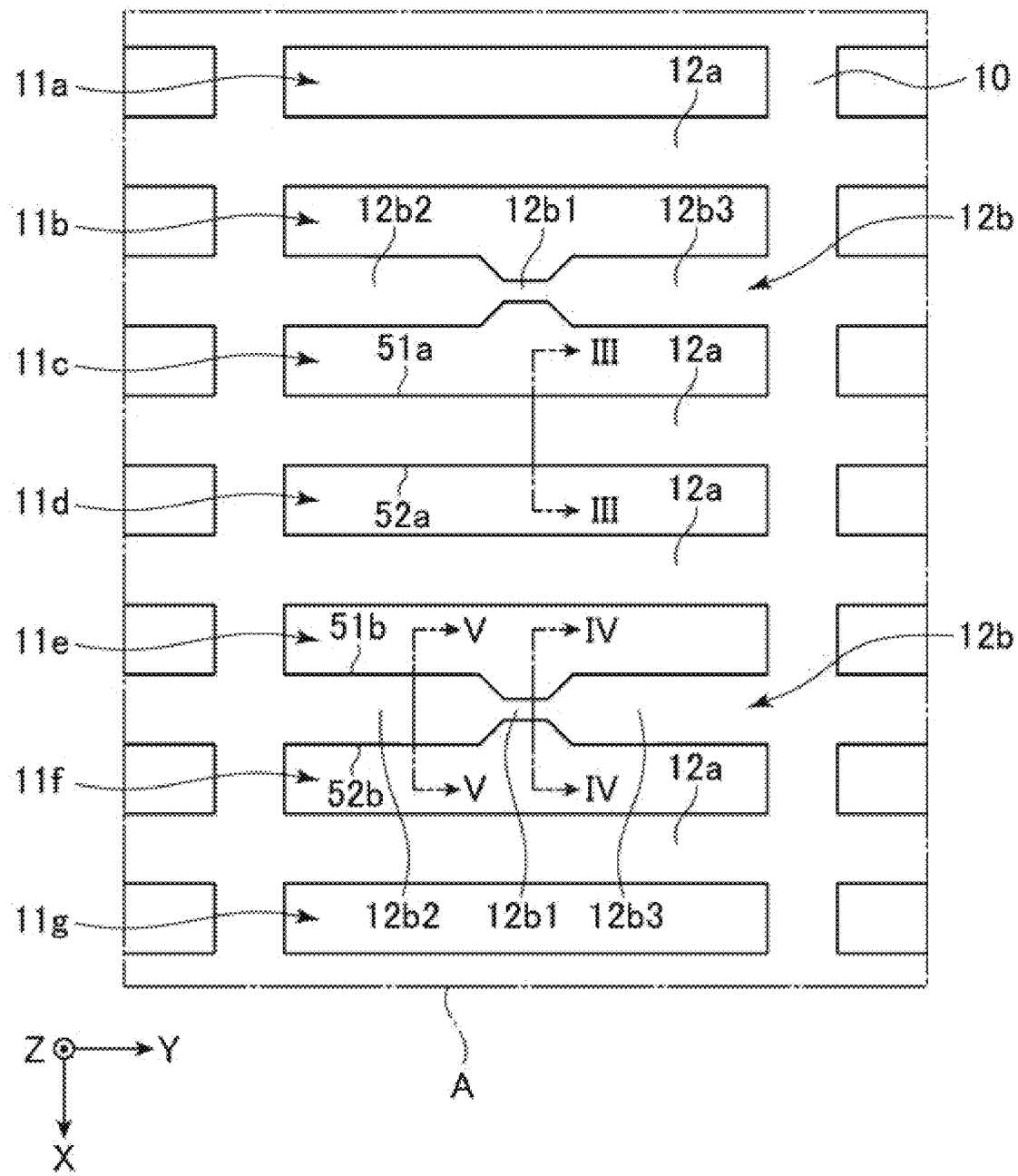
FIG. 7 is a view schematically showing a region A of the trench capacitor shown in FIG. 1.
Figure 8:
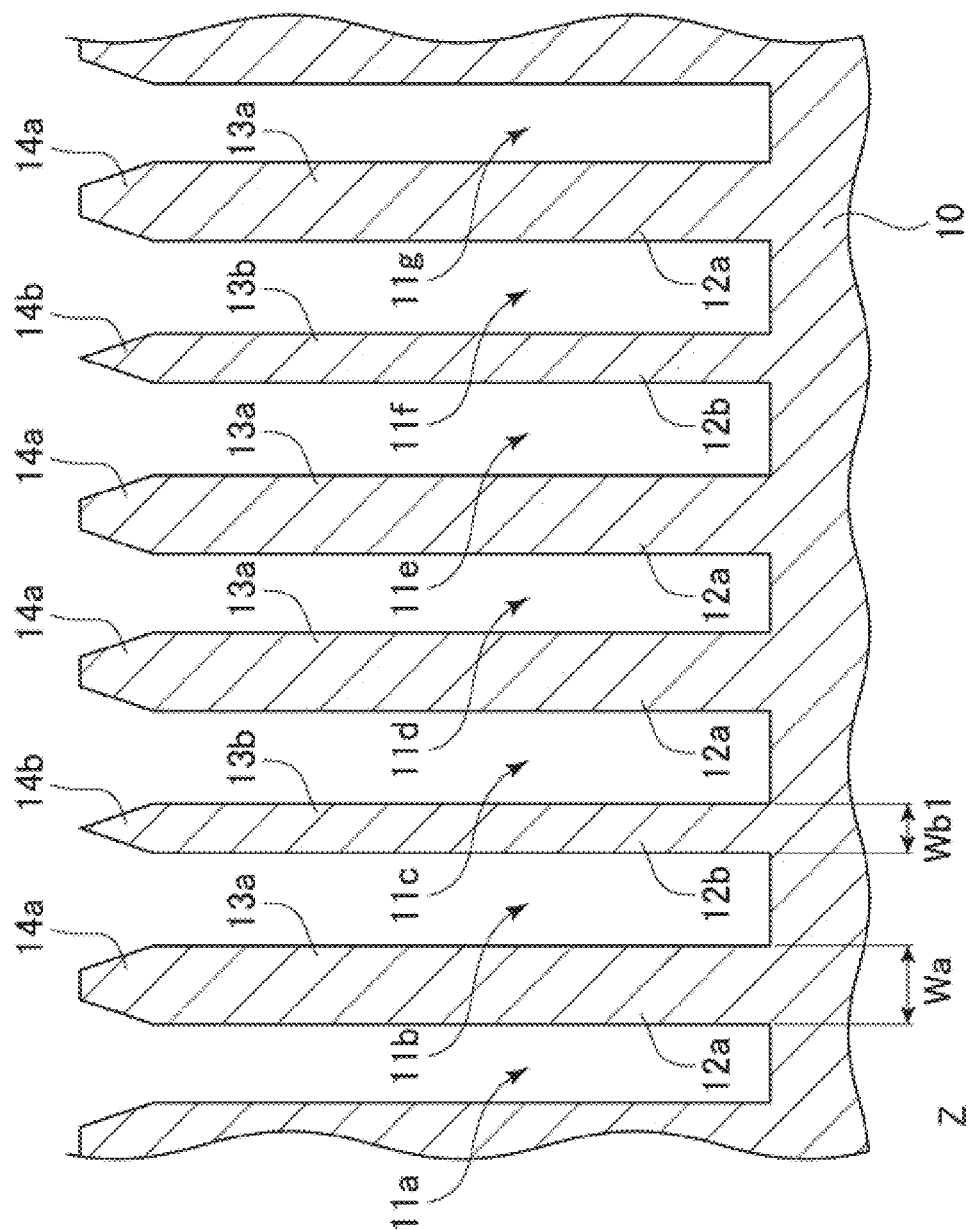
FIG. 8 is a sectional view schematically showing the section cut along the line II-II of the trench capacitor shown in FIG. 1, in which the members other than the base member are not shown for the sake of convenience of explaining a structure of the base member.
Figure 9:
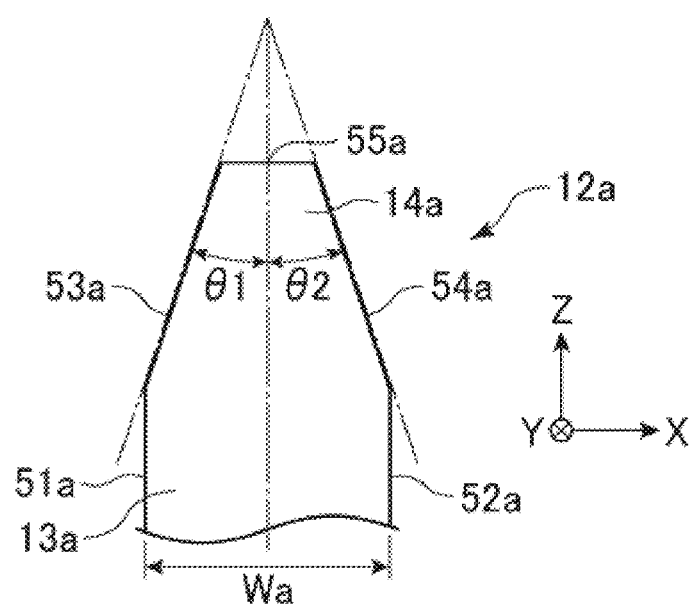
FIG. 9 is a sectional view schematically showing a section of a wall 12a of the trench capacitor shown in FIG. 7 cut along a line III-III.
Figure 10:
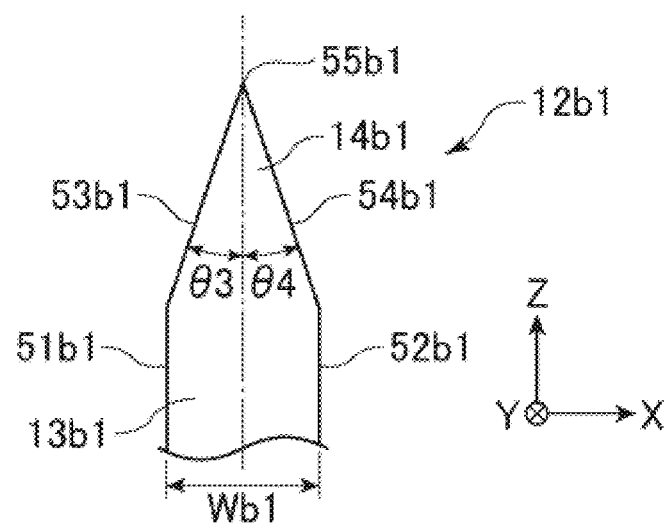
FIG. 10 is a sectional view schematically showing a section of a wall 12b of the trench capacitor shown in FIG. 7 cut along a line Iv-Iv.
Figure 11:
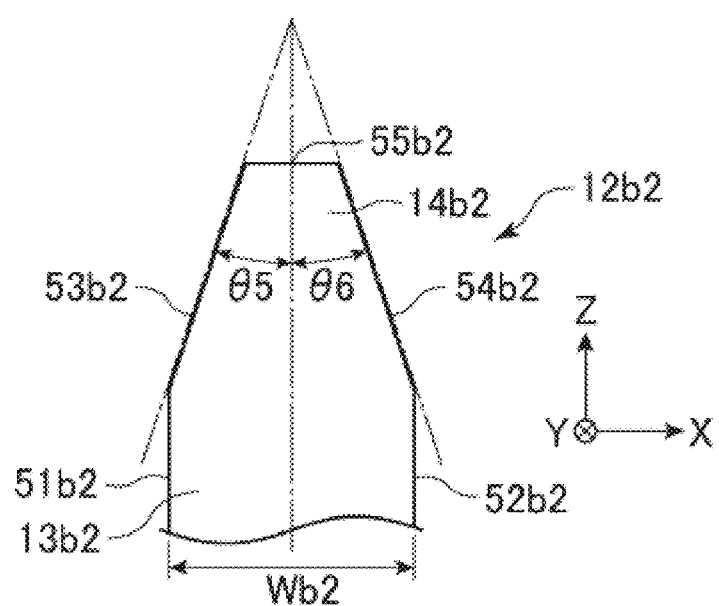
FIG. 11 is a sectional view schematically showing a section of the wall 12b of the trench capacitor shown in FIG. 7 cut along a line v-v.

With reference to FIG. 7 to FIG. 11, a description is given of the trenches 11 formed in the base member 10 and walls partitioning the trenches 11 from each other. FIG. 7 is a plan view schematically showing a region A of the trench capacitor 1, and FIG. 8 is a sectional view schematically showing a section of the trench capacitor 1 cut along a line II-II. FIG. 9 is a sectional view schematically showing a section of a wall 12a of the trench capacitor 1 cut along a line FIG. 10 is a sectional view schematically showing a section of a wall 12b of the trench capacitor 1 cut along a line Iv-Iv, and FIG. 11 is a sectional view schematically showing a section of the wall 12b of the trench capacitor 1 cut along a line v-v. In FIG. 7 to FIG. 11, for the sake of convenience of explaining the base member 10 and the trenches 11, other members are not shown.

As shown in FIG. 7, trenches 11a to 11g are formed in the region A of the base member 10. The trench 11a is adjacent to the trench 11b in the X-axis direction and is separated from the trench 11b by the wall 12a. The trench 11b is adjacent to the trench 11a and the trench 11c in the X-axis direction and is separated from the trench 11a by the wall 12a as described above and from the trench 11c by the wall 12b. Similarly, the trenches 11c to 11g are also adjacent to the other trenches in the X-axis direction and are separated therefrom by the wall 12a or the wall 12b. The X-axis direction is an example of the first direction orthogonal to the depth direction of the trenches 11 (namely, the Z-axis direction).

The wall 12a and the wall 12b are each a convex-shaped portion formed in the base member 10 and configured to separate each pair of adjacent ones of the trenches 11 in the X-axis direction from each other. The wall 12a and the wall 12b constitute part of the base member 10. The wall 12a is an example of the second wall, and the wall 12b is an example of the first wall.

In the embodiment shown, the wall 12a has a base portion 13a and a distal end portion 14a. The base portion 13a is formed to extend upward from the bottom of the trenches 11. In the embodiment shown in FIG. 7, the base portion 13a is formed so that a width Wa thereof in the X-axis direction is substantially uniform across an entire length thereof in the Y-axis direction. Furthermore, in the embodiment shown in FIG. 8, the base portion 13a is formed so that the width Wa thereof in the X-axis direction is substantially uniform across an entire length thereof in the Z-axis direction. The base portion 13a has a side surface 51a extending along a YZ plane and a side surface 52a opposed to the side surface 51a. The side surface 52a extends parallel to the side surface 51a and is spaced apart by Wa from the side surface 51a in the X-axis direction.

The distal end portion 14a extends upward from an upper end of the base portion 13a. As shown in FIG. 9, the distal end portion 14a is formed to have a width decreasing toward a distal end thereof (the positive direction of the Z axis) in an XZ plane. The distal end portion 14a has an inclined surface 53a extending at an angle θ1 with respect to the Z axis, an inclined surface 54a extending at an angle θ2 with respect to the Z axis on an opposite side to the inclined surface 53a, and a wall upper surface 55a connecting the inclined surface 53a to the inclined surface 54a. As described above, the inclined surface 53a is inclined at the angle θ1 with respect to the depth direction of the trenches 11, and the inclined surface 54a is inclined at the angle θ2 with respect to the depth direction of the trenches 11. Thus, an angle formed between the inclined surface 53a and the wall upper surface 55a is 90°+θ1, and an angle formed between the inclined surface 54a and the wall upper surface 55a is 90°+θ2. The angle θ1 and the angle θ2 may be equal to or different from each other. In one embodiment, the distal end portion 14a is formed so that the angle θ1 and the angle θ2 each have an angle value within a range of 1° to 120°. In one embodiment, the distal end portion 14a is formed so that the angle θ1 and the angle θ2 are both 30°. The wall upper surface 55a is formed to have a width in the X-axis direction smaller than the width Wa of the base portion 13a in the X-axis direction. The inclined surface 53a is an example of the fifth inclined surface, and the inclined surface 54a is an example of the sixth inclined surface. The wall upper surface 55a is an example of the second wall upper surface.

In one embodiment, the wall 12b has a base portion 13b and a distal end portion 14b. Similarly to the base portion 13a, the base portion 13b is formed to extend upward from the bottom of the trenches 11. The wall 12b has a narrow portion 12b1 having a decreased width in the X-axis direction, a wide portion 12b2 having a width larger than that of the narrow portion 12b1 in the X-axis direction, and a wide portion 12b3 having a width larger than that of the narrow portion 12b1 in the X-axis direction. In the embodiment shown in FIG. 7, the narrow portion 12b1 is provided at substantially a middle of the wall 12b in the Y-axis direction. The wide portion 12b2 is provided on a negative side with respect to the narrow portion 12b1 in the Y-axis direction, and the wide portion 12b3 is provided on a positive side with respect to the narrow portion 12b1 in the Y-axis direction. The narrow portion 12b1 of the wall 12b is an example of the first portion of the first wall. The wide portion 12b2 and the wide portion 12b3 are each an example of the second portion of the first wall.

As shown in FIG. 10, the narrow portion 12b1 of the wall 12b has a side surface 51b1 extending along the YZ plane and a side surface 52b2 opposed to the side surface 51b1. The side surface 52b2 extends parallel to the side surface 51b1 and is spaced apart by Wb1 from the side surface 51b1 in the X-axis direction. That is, a base portion 13b1 of the narrow portion 12b1 of the wall 12b is formed to have a width Wb1 in the X-axis direction.

A distal end portion 14b1 of the narrow portion 12b1 extends upward from an upper end of the base portion 13b1. As shown in FIG. 10, the distal end portion 14b1 is formed to have a width decreasing toward a distal end thereof (the positive direction of the Z axis) in the XZ plane. The distal end portion 14b1 has an inclined surface 53b1 extending at an angle θ3 with respect to the Z axis and an inclined surface 54b1 extending at an angle θ4 with respect to the Z axis on an opposite side to the inclined surface 53b1. As described above, the inclined surface 53b1 is inclined at the angle θ3 with respect to the depth direction of the trenches 11, and the inclined surface 54b1 is inclined at the angle θ4 with respect to the depth direction of the trenches 11. The angle θ3 and the angle θ4 may be equal to or different from each other. In one embodiment, the distal end portion 14b1 is formed so that the angle θ3 and the angle θ4 each have an angle value within a range of 1° to 120°. In one embodiment, the distal end portion 14b1 is formed so that the angle θ3 and the angle θ4 are both 30°. The inclined surface 53b1 is an example of the first inclined surface, and the inclined surface 54b1 is an example of the second inclined surface.

The inclined surface 53b1 and the inclined surface 54b1 are connected to each other at their respective upper ends. Accordingly, the distal end portion 14b1 of the narrow portion 12b1 is formed so that a distal end 55b1 of the distal end portion 14b1 has an acute angle in the XZ plane. In one embodiment, the distal end portion 14b1 is formed to have a distal end curvature radius within a range of 0.1 nm to 50 nm. In one embodiment, the distal end portion 14b1 is formed to have a distal end curvature radius of 1.0 nm. Since the angle θ3 and the angle θ4 are both within the range of 1° to 120°, a distal end angle formed between the inclined surface 53b1 and the inclined surface 54b1 has an angle value within a range of 2° to 240°.

In the embodiment shown, the wide portion 12b2 of the wall 12b has a base portion 13b2 and a distal end portion 14b2. The base portion 13b2 is formed to extend upward from the bottom of the trenches 11. As shown in FIG. 8, the base portion 13b2 in one embodiment is formed so that a width Wb2 thereof in the X-axis direction is substantially uniform across an entire length thereof in the Z-axis direction. The base portion 13b2 has a side surface 51b2 extending along the YZ plane and a side surface 52b2 opposed to the side surface 51b2. The side surface 52b2 extends parallel to the side surface 51b2 and is spaced apart by Wb2 from the side surface 51b1 in the X-axis direction. That is, the base portion 13b2 of the wide portion 12b2 of the wall 12b is formed to have the width Wb2 in the X-axis direction.

The distal end portion 14b2 extends upward from an upper end of the base portion 13b2. As shown in FIG. 11, the distal end portion 14b2 is formed to have a width decreasing toward a distal end thereof (the positive direction of the Z axis) in the XZ plane. The distal end portion 14b2 has an inclined surface 53b2 extending at an angle θ5 with respect to the Z axis, an inclined surface 54b2 extending at an angle θ6 with respect to the Z axis on an opposite side to the inclined surface 53b2, and a wall upper surface 55b2 connecting the inclined surface 53b2 to the inclined surface 54b2. As described above, the inclined surface 53b2 is inclined at the angle θ5 with respect to the depth direction of the trenches 11, and the inclined surface 54b2 is inclined at the angle θ6 with respect to the depth direction of the trenches 11. Thus, an angle formed between the inclined surface 53b2 and the wall upper surface 55b2 is 90°+θ5, and an angle formed between the inclined surface 54b2 and the wall upper surface 55b2 is 90°+θ6. The angle θ5 and the angle θ6 may be equal to or different from each other. In one embodiment, the distal end portion 14b2 is formed so that the angle θ5 and the angle θ6 each have an angle value within a range of 1° to 120°. In one embodiment, the distal end portion 14b2 is formed so that the angle θ5 and the angle θ6 are both 30°. The wall upper surface 55b2 is formed to have a width in the X-axis direction smaller than the width Wb2 of the base portion 13b2 in the X-axis direction. The inclined surface 53b2 is an example of the third inclined surface, and the inclined surface 54b2 is an example of the fourth inclined surface. The wall upper surface 55b2 is an example of the first wall upper surface.

In one embodiment, the narrow portions 12b1 of the walls 12b are all provided at positions not overlapping with either the external electrode 2 or the external electrode 3 in plan view.

In the above-described embodiment, the wall 12a and the wide portion 12b2 of the wall 12b may be formed to be equal in shape in an XY plane. In this case, the wall 12a and the wide portion 12b2 of the wall 12b are formed so that θ1 is equal to θ5, θ2 is equal to θ6, and Wa is equal to Wb2.

In one embodiment, θ1, θ3, and θS may be equal to or different from one another. Further, θ2, θ4, and θ6 may be equal to or different from one another.

Next, a further description is given of the MIM structure 20. As described earlier, the MIM structure 20 is provided on the base member 10. As shown, the MIM structure 20 is provided on the base member 10 so as to be embedded in the trenches 11.

As shown in FIG. 4, the MIM structure 20 is a laminate composed of a dielectric layer and a conductor layer alternately stacked on each other. As shown in FIG. 4, the MIM structure 20 in one embodiment includes a first negative internal electrode layer 22a, a first dielectric layer 21a provided on the first negative internal electrode layer 22a, a first positive internal electrode layer 23a provided on the first dielectric layer 21a, a second dielectric layer 21b provided on the first positive internal electrode layer 23a, a second negative internal electrode layer 22b provided on the second dielectric layer 21b, a third dielectric layer 21c provided on the second negative internal electrode layer 22b, and a second positive internal electrode layer 23b provided on the third dielectric layer 21c.

In the embodiment shown, the MIM structure 20 includes three MIM layers. A first MIM layer includes the first dielectric layer 21a, the first negative internal electrode layer 22a provided on a lower surface of the first dielectric layer 21a, and the first positive internal electrode layer 23a provided on an upper surface of the first dielectric layer 21a. A second MIM layer includes the second dielectric layer 21b, the first positive internal electrode layer 23a provided on a lower surface of the second dielectric layer 21b, and the second negative internal electrode layer 22b provided on an upper surface of the second dielectric layer 21b. A third MIM layer includes the third dielectric layer 21c, the second negative internal electrode layer 22b provided on a lower surface of the third dielectric layer 21c, and the second positive internal electrode layer 23b provided on an upper surface of the third dielectric layer 21c. The first positive internal electrode layer 23a serves as an upper-side electrode layer in the first MIM layer and also as a lower-side electrode layer in the second MIM layer. Similarly, the second negative internal electrode layer 22b serves as an upper-side electrode layer in the second MIM layer and also as a lower-side electrode layer in the third MIM layer.

Herein, when there is no need to distinguish among the first dielectric layer 21a, the second dielectric layer 21b, and the third dielectric layer 21c, these layers may be referred to collectively as a dielectric layer 21. Similarly, when there is no need to distinguish between the first negative internal electrode layer 22a and the second negative internal electrode layer 22b, these layers may be referred to collectively as a negative internal electrode layer 22. Further, when there is no need to distinguish between the first positive internal electrode layer 23a and the second positive internal electrode layer 23b, these layers may be referred to collectively as a positive internal electrode layer 23.

Materials that can be used to form the dielectric layer 21 include barium strontium titanate (BST), barium titanate (BTO), strontium titanate (STO), silicon oxide ($SiO_2$), silicon nitride (SiN), silicon oxynitride (SiON), zirconia (Zr), alumina ($Al_2O_3$), hafnium oxide ($HfO_2$), titanium oxide ($TiO_2$), and any other dielectric material. The first dielectric layer 21a, the second dielectric layer 21b, and the third dielectric layer 21c may be made of the same dielectric material or different materials from one another. The material of the dielectric layer 21 is not limited to those explicitly described herein.

The dielectric layer 21 is formed by, for example, a sputtering method, a CVD method, an atomic layer deposition (ALD) method, or any other known method. The dielectric layer 21 is formed to have a thickness of, for example, 1 nm to 500 nm. In one embodiment, the dielectric layer 21 has a thickness of 30 nm.

Materials that can be used to form the negative internal electrode layer 22 and the positive internal electrode layer 23 include nickel (Ni), copper (Cu), palladium (Pd), platinum (Pt), silver (Ag), gold (Au), ruthenium (Ru), tungsten (W), molybdenum (Mo), titanium (Ti), conductive silicon, or any other metal material, an alloy material containing one or more of these metal elements, and compounds of the above-described metal elements. In one embodiment, as the material of the negative internal electrode layer 22 and the positive internal electrode layer 23, titanium nitride (TiN) is used. The material of the negative internal electrode layer 22 and the positive internal electrode layer 23 is not limited to those explicitly described herein.

The negative internal electrode layer 22 and the positive internal electrode layer 23 are formed by, for example, the sputtering method, an evaporation method, a plating method, or any other known method. Each of the negative internal electrode layer 22 and the positive internal electrode layer 23 is formed to have a thickness of, for example, 1 nm to 500 nm. In one embodiment, each of the negative internal electrode layer 22 and the positive internal electrode layer 23 has a thickness of 30 nm. The thickness of the negative internal electrode layer 22 and the positive internal electrode layer 23 is not limited to those explicitly described herein.

In order to improve weather resistance of the trench capacitor 1, the barrier layer 30 is provided on the MIM structure 20. In one embodiment, the barrier layer 30 is provided between the MIM structure 20 and the protective layer 40 so that moisture released from the protective layer 40 or moisture in the atmosphere will not reach the MIM structure 20 that generates a capacitance. The barrier layer 30 may be a thin film excellent in hydrogen gas barrier property. Materials that can be used to form the barrier layer 30 include alumina ($Al_2O_3$), silicon oxide ($SiO_2$), silicon oxynitride (SiON), zirconia ($ZrO_2$), and any other insulating material. The barrier layer 30 is formed by, for example, the sputtering method, the CVD method, or any other known method. The barrier layer 30 is formed to have a thickness of, for example, 5 nm to 500 nm. In one embodiment, the barrier layer 30 has a thickness of 50 nm. The material and thickness of the barrier layer 30 are not limited to those explicitly described herein.

In order to protect the MIM structure 20 from the outer environment, the protective layer 40 is provided on the barrier layer 30. The protective layer 40 is provided so as to protect the MIM structure 20 from, for example, external mechanical damage such as an impact. Materials that can be used to form the protective layer 40 include silicon oxide ($SiO_2$), silicon nitride (SiN), silicon oxynitride (SiON), and any other insulating material. The protective layer 40 is formed by, for example, applying photosensitive polyimide by a spin coating method and subjecting the thus applied polyimide to exposure, development, and curing. The protective layer 40 is provided on the barrier layer 30 by any other known method. The protective layer 40 is formed to have a thickness of, for example, 200 nm to 5000 nm. In one embodiment, the protective layer 40 has a thickness of 3000 nm. The material and thickness of the protective layer 40 are not limited to those explicitly described herein.

In one embodiment, the protective layer 40 has one or a plurality of through holes 40a provided therethrough. As shown in FIG. 1, in the embodiment shown, eight through holes 40a are provided through the protective layer 40. The through holes 40a are each provided at a position overlapping with the narrow portion 12b1 of the wall 12b in plan view. In one embodiment, the through holes 40a are all provided at positions not overlapping with either the external electrode 2 or the external electrode 3 in plan view. As shown in FIG. 1, the through holes 40a are provided at positions shifted to a positive side in the Y-axis direction beyond an end surface of the external electrode 2 on the positive side in the Y-axis direction and shifted to a negative side in the Y-axis direction beyond an end surface of the external electrode 3 on the negative side in the Y-axis direction. It is not necessary that the through holes 40a be provided through the protective layer 40.

As shown in FIG. 5, a contact hole 62a and a contact hole 62b are provided in part of a region in which the MIM structure 20, the barrier layer 30, and the protective layer 40 are opposed to the external electrode 2. The contact hole 62a is provided to penetrate through the protective layer 40, the barrier layer 30, and the first to fourth layers of the MIM structure 20 from the top (namely, the second positive internal electrode layer 23b, the third dielectric layer 21c, the second negative internal electrode layer 22b, and the second dielectric layer 21b). The contact hole 62b is provided to penetrate through the protective layer 40 and the barrier layer 30.

As shown in FIG. 6, a contact hole 63a and a contact hole 63b are provided in part of a region in which the MIM structure 20, the barrier layer 30, and the protective layer 40 are opposed to the external electrode 3. The contact hole 63a is provided to penetrate through the protective layer 40, the barrier layer 30, and the first to sixth layers of the MIM structure 20 from the top (namely, the second positive internal electrode layer 23b, the third dielectric layer 21c, the second negative internal electrode layer 22b, the second dielectric layer 21b, the first positive internal electrode layer 23a, and the first dielectric layer 21a). The contact hole 62b is provided to penetrate through the protective layer 40, the barrier layer 30, and the first to second layers of the MIM structure 20 from the top (namely, the second positive internal electrode layer 23b and the third dielectric layer 21c).

The contact hole 62a, the contact hole 62b, the contact hole 63a, and the contact hole 63b are formed by, for example, providing, on the protective layer 40, a mask that is open at positions corresponding to these contact holes, respectively, and etching the protective layer 40 on which the mask is provided, the barrier layer 30, and part of the MIM structure 20 as necessary.

Lead-out electrodes 2a, 2b, 3a, and 3b are provided in the contact holes 62a, 62b, 63a, and 63b, respectively. The lead-out electrode 2a is electrically connected at a lower end thereof to the first positive internal electrode layer 23a and electrically connected at an upper end thereof to the external electrode 2. The lead-out electrode 2b is electrically connected at a lower end thereof to the second positive internal electrode layer 23b and electrically connected at an upper end thereof to the external electrode 2. The lead-out electrode 3a is electrically connected at a lower end thereof to the first negative internal electrode layer 22a and electrically connected at an upper end thereof to the external electrode 3. The lead-out electrode 3b is electrically connected at a lower end thereof to the second negative internal electrode layer 22b and electrically connected at an upper end thereof to the external electrode 3.

Materials that can be used to form the lead-out electrodes 2a, 2b, 3a, and 3b include copper (Cu), nickel (Ni), tin (Sn), palladium (Pd), platinum (Pt), silver (Ag), gold (Au), any other metal material, or an alloy material containing one or more of these metal elements. The lead-out electrodes 2a, 2b, 3a, and 3b are formed by the evaporation method, the sputtering method, the plating method, or any other known method.

Materials that can be used to form the external electrode 2 and the external electrode 3 include copper (Cu), nickel (Ni), tin (Sn), palladium (Pd), platinum (Pt), silver (Ag), gold (Au), any other metal material, or an alloy material containing one or more of these metal elements. The external electrode 2 and the external electrode 3 are formed by applying a conductive paste containing any of these metal materials on an upper surface of the protective layer 40. At least one of a solder barrier layer and a solder wetting layer may be formed on the external electrode 2 and the external electrode 3 as necessary. In one embodiment, the external electrode 2 and the external electrode 3 are formed to have a thickness of 1000 nm to 10000 nm.

Figure 12A:
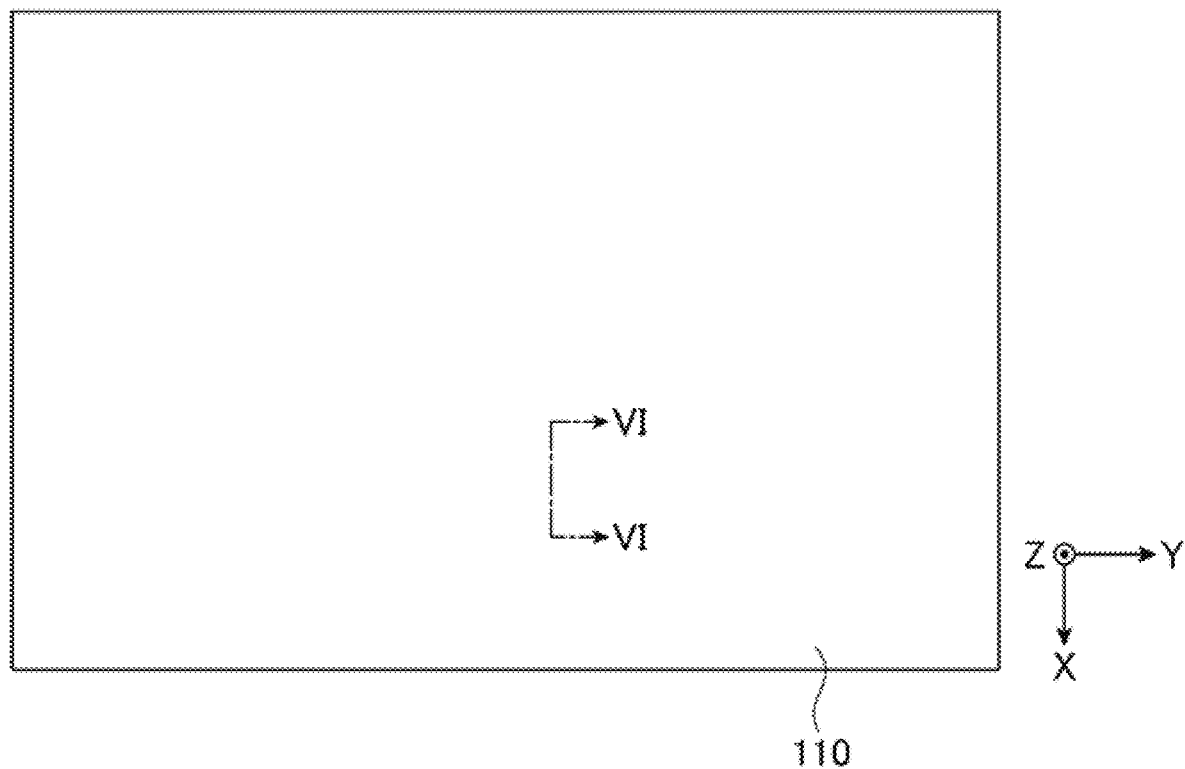
FIG. 12A is a view for explaining a process for manufacturing the trench capacitor according to one embodiment of the present invention, illustrating a process step of preparing a base member.
Figure 12B:
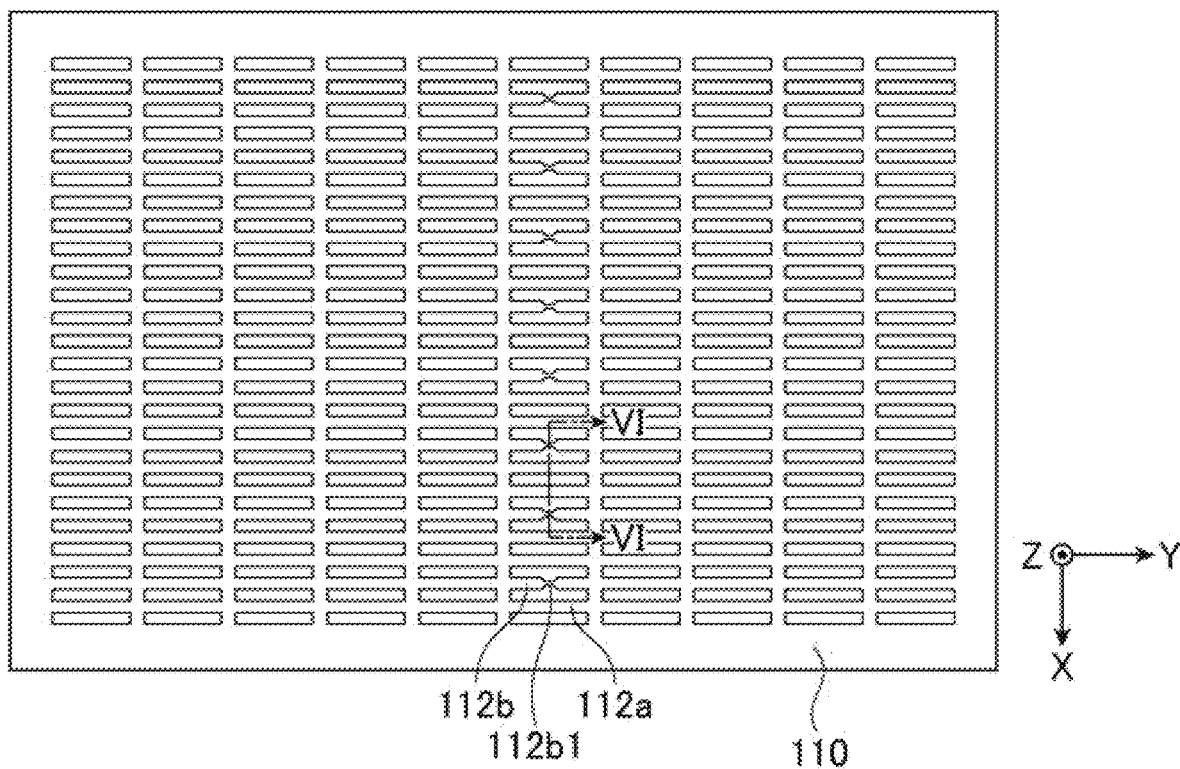
FIG. 12B is a view for explaining the process for manufacturing the trench capacitor according to one embodiment of the present invention, illustrating a process step of forming trenches in the base member.
Figure 13A:
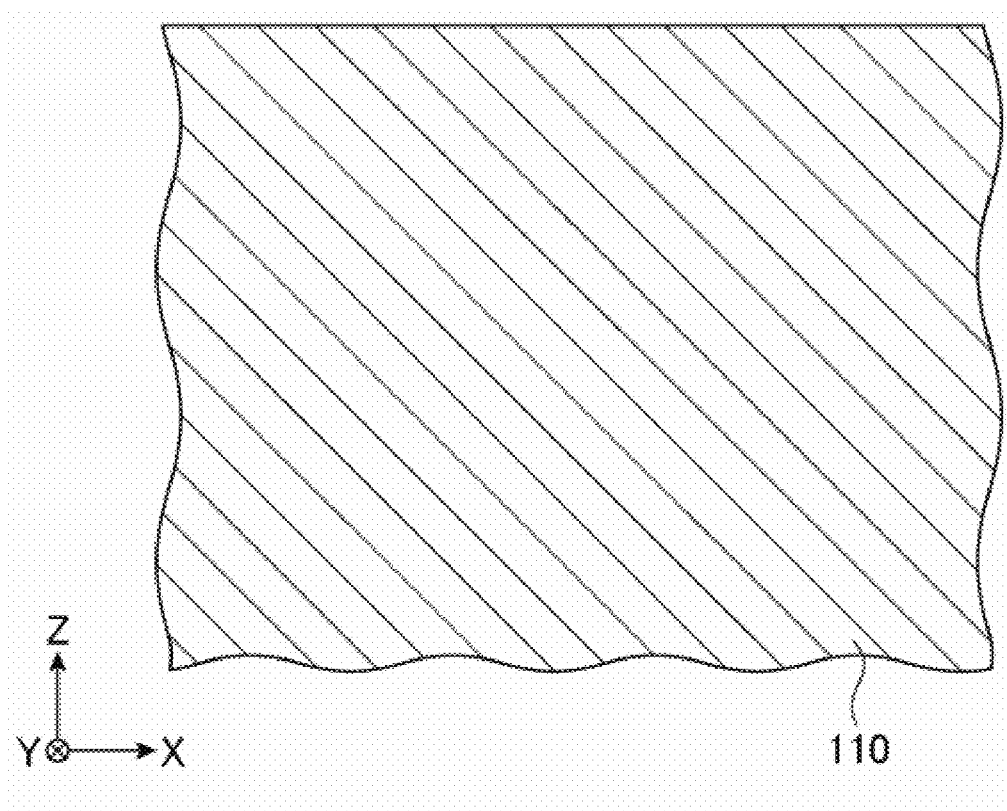
FIG. 13A is a view for explaining the process for manufacturing the trench capacitor according to one embodiment of the present invention, illustrating the process step of preparing the base member.
Figure 13B:
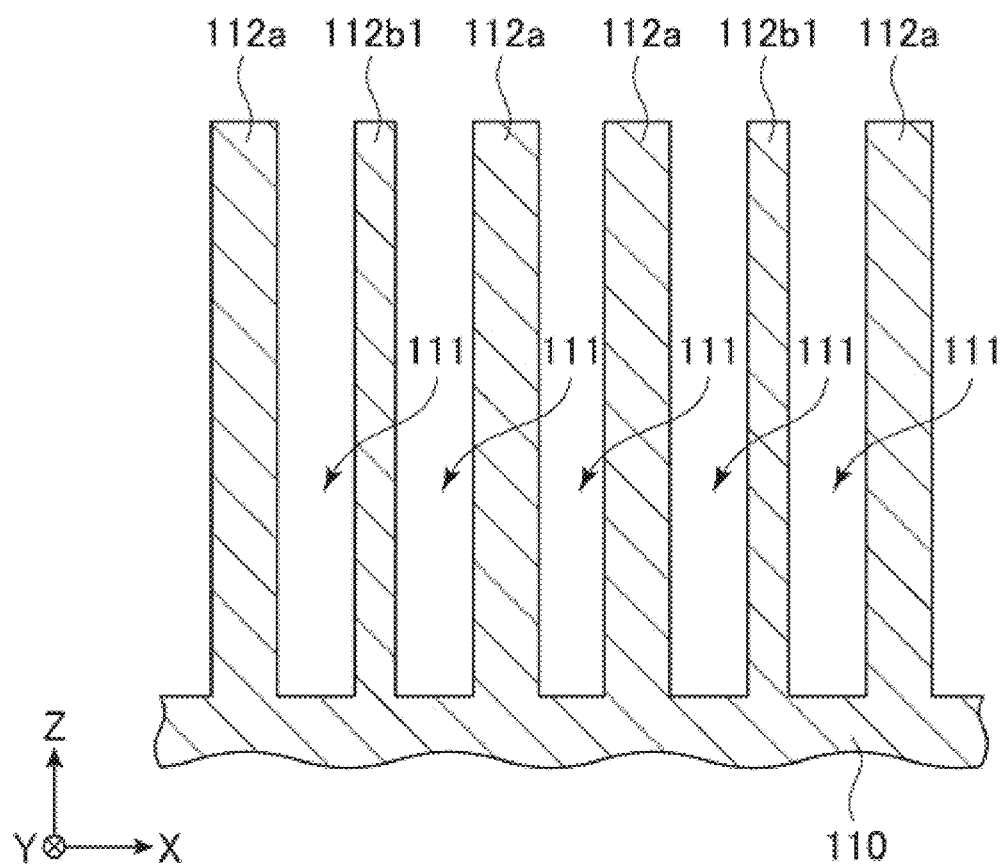
FIG. 13B is a view for explaining the process for manufacturing the trench capacitor according to one embodiment of the present invention, illustrating the process step of forming the trenches in the base member.
Figure 13C:
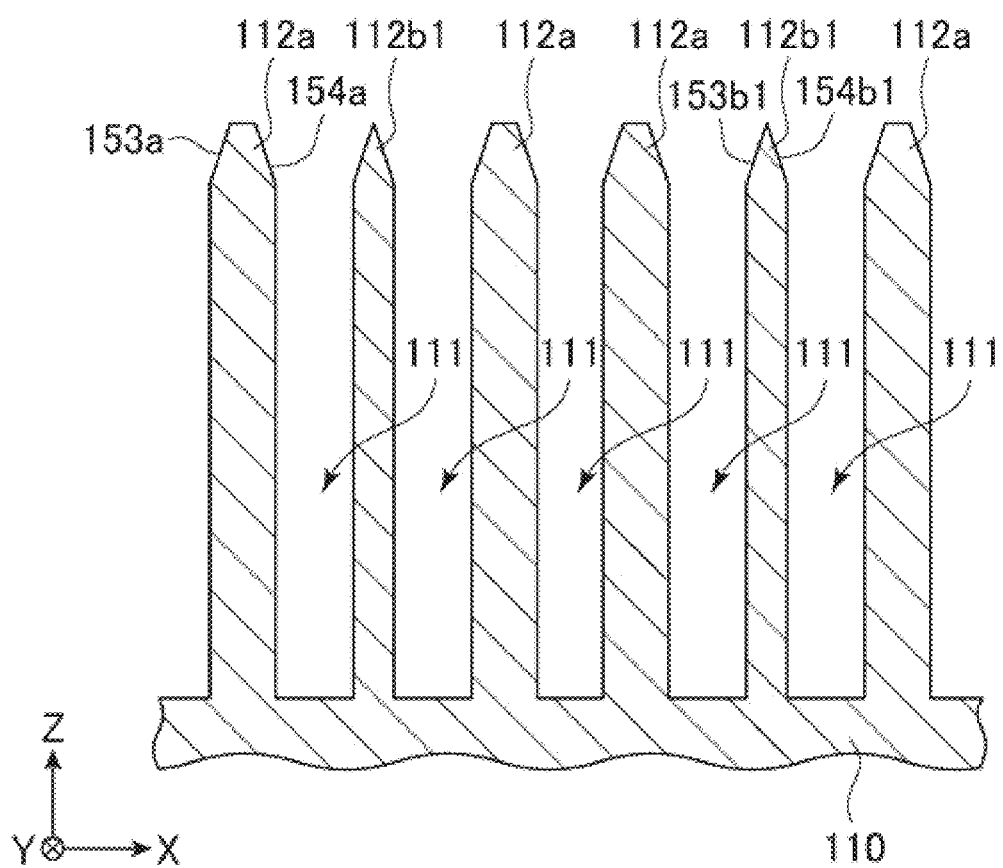
FIG. 13C is a view for explaining the process for manufacturing the trench capacitor according to one embodiment of the present invention, illustrating a process step of providing an inclined portion in each of the walls.
Figure 13D:
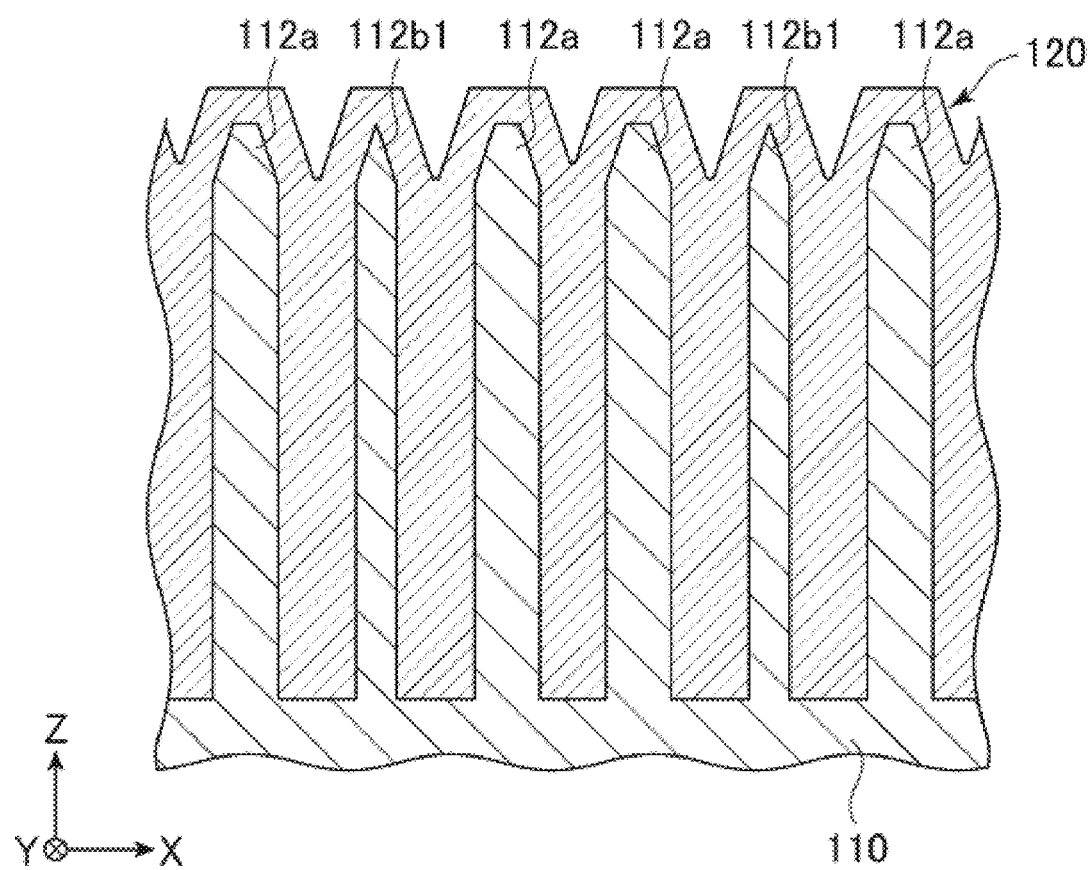
FIG. 13D is a view for explaining the process for manufacturing the trench capacitor according to one embodiment of the present invention, illustrating a process step of providing an MIM structure.
Figure 13E:
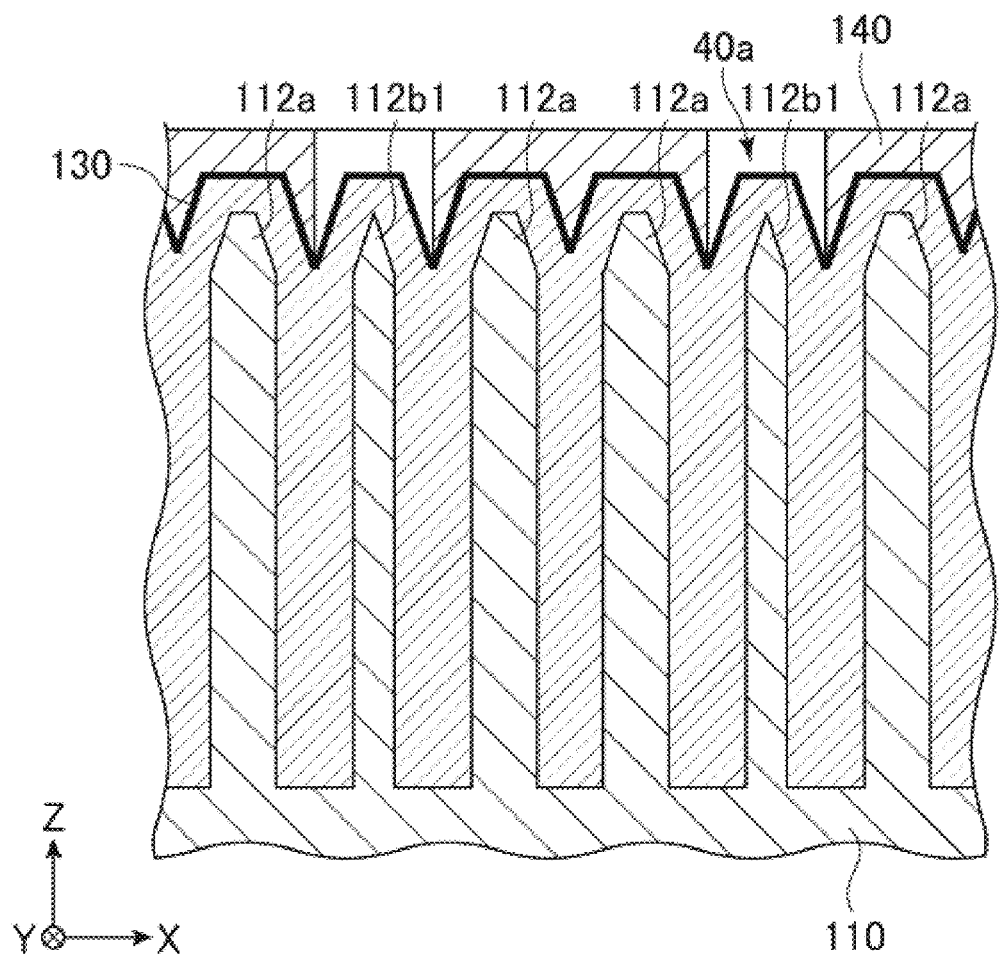
FIG. 13E is a view for explaining the process for manufacturing the trench capacitor according to one embodiment of the present invention, illustrating a process step of providing a barrier layer and a process step of providing a protective layer.

Next, with reference to FIG. 12A to FIG. 12B and FIG. 13A to FIG. 13E, a description is given of a method for manufacturing the trench capacitor according to one embodiment of the present invention. FIG. 12A to FIG. 12B are each a plan view schematically showing a base member in a manufacturing process, and FIG. 13A to FIG. 13B are each a sectional view schematically showing an XZ section of the base member shown in FIG. 12A to FIG. 12B along a line VI-VI. FIG. 13C to FIG. 13E are views explaining manufacturing process steps performed following a process step shown in FIG. 13b, each of which schematically shows the XZ section of the base member along the line VI-VI.

First, an Si base member 110 is prepared as shown in FIG. 12A and FIG. 13A. Next, a mask having openings corresponding to a pattern of trenches is provided on a surface of the base member 110. The mask has an opening pattern corresponding to the trenches 11 shown in FIG. 1. A plurality of openings formed through the mask are each formed in a substantially rectangular shape in plan view. Furthermore, the mask is formed so that, at each position corresponding to a narrow portion 12b1, it has a decreased width so as to have a shape corresponding to the narrow portion 12b1. Next, the base member 110 on which the mask is provided is etched, and thus a plurality of trenches 111 are formed in the base member 110 as shown in FIG. 12B and FIG. 13B. Each pair of adjacent ones of the trenches 111 in the X-axis direction are separated from each other by a wall 112. Some of the walls 112 include a narrow portion 112b1 having a decreased width in the X-axis direction. In the following description, these walls including the narrow portion 112b1 are each referred to as a wall 112b, and the other walls not including the narrow portion 112b1 are each referred to as a wall 112a. The etching may be performed by the deep RIE.

Next, the mask is removed from the base member 110, and isotropic etching is performed with respect to the base member 110 from which the mask has thus been removed. As shown in FIG. 13C, distal end portions of the wall 112a and the wall 112b are chamfered by the isotropic etching. By the isotropic etching, the wall 112a is processed to have, at the distal end portion thereof, an inclined surface 153a inclined at a predetermined angle (for example, 30°) with respect to the Z-axis direction and an inclined surface 154a inclined at a predetermined angle (for example, 30°) with respect to the Z-axis direction on an opposite side to the inclined surface 153a, and the narrow portion 112b1 of the wall 112b is processed to have an inclined surface 153b1 inclined at a predetermined angle (for example, 30°) with respect to the Z-axis direction and an inclined surface 153b2 inclined at a predetermined angle (for example, 30°) with respect to the Z-axis direction on an opposite side to the inclined surface 153b1. By the isotropic etching, the narrow portion 112b1 is formed so that a distal end thereof has an acute angle.

Next, an electrode layer and a dielectric layer are alternately stacked to form an MIM structure 120 on an upper surface of the base member 110 as shown in FIG. 13D. The MIM structure 120 is formed so as to be embedded in the trenches 111. The MIM structure 120 includes, for example, three dielectric layers, two positive internal electrode layers, and two negative internal electrode layers. The dielectric layers are made of zirconia, and the positive internal electrode layers and the negative internal electrode layers are made of TiN. The dielectric layers, the positive internal electrode layers, and the negative internal electrode layers are formed by the sputtering method. The material of the dielectric layers is not limited to zirconia, and the material of the positive internal electrode layers and the negative internal electrode layers is not limited to TiN. The dielectric layers, the positive internal electrode layers, and the negative internal electrode layers may be formed by any of various known methods other than the sputtering method.

Next, as shown in FIG. 13E, a barrier layer 130 is formed on the MIM structure 120, and a protective layer 140 is formed on the barrier layer 130. The protective layer 140 has a through hole 40a formed at each position overlapping with the narrow portion 112b1 in plan view. The through hole 140a is formed by providing, on an upper surface of the protective layer 140, a mask that is open at each position corresponding to the narrow portion 112b1 and etching the protective layer 140 on which the mask is provided. Next, a positive external electrode and a negative internal electrode are provided, the positive external electrode being connected to one of the positive internal electrode layers of the MIM structure 120, the negative internal electrode being connected to one of the negative internal electrode layers of the MIM structure 120, and thus the trench capacitor is obtained.

Figure 14:
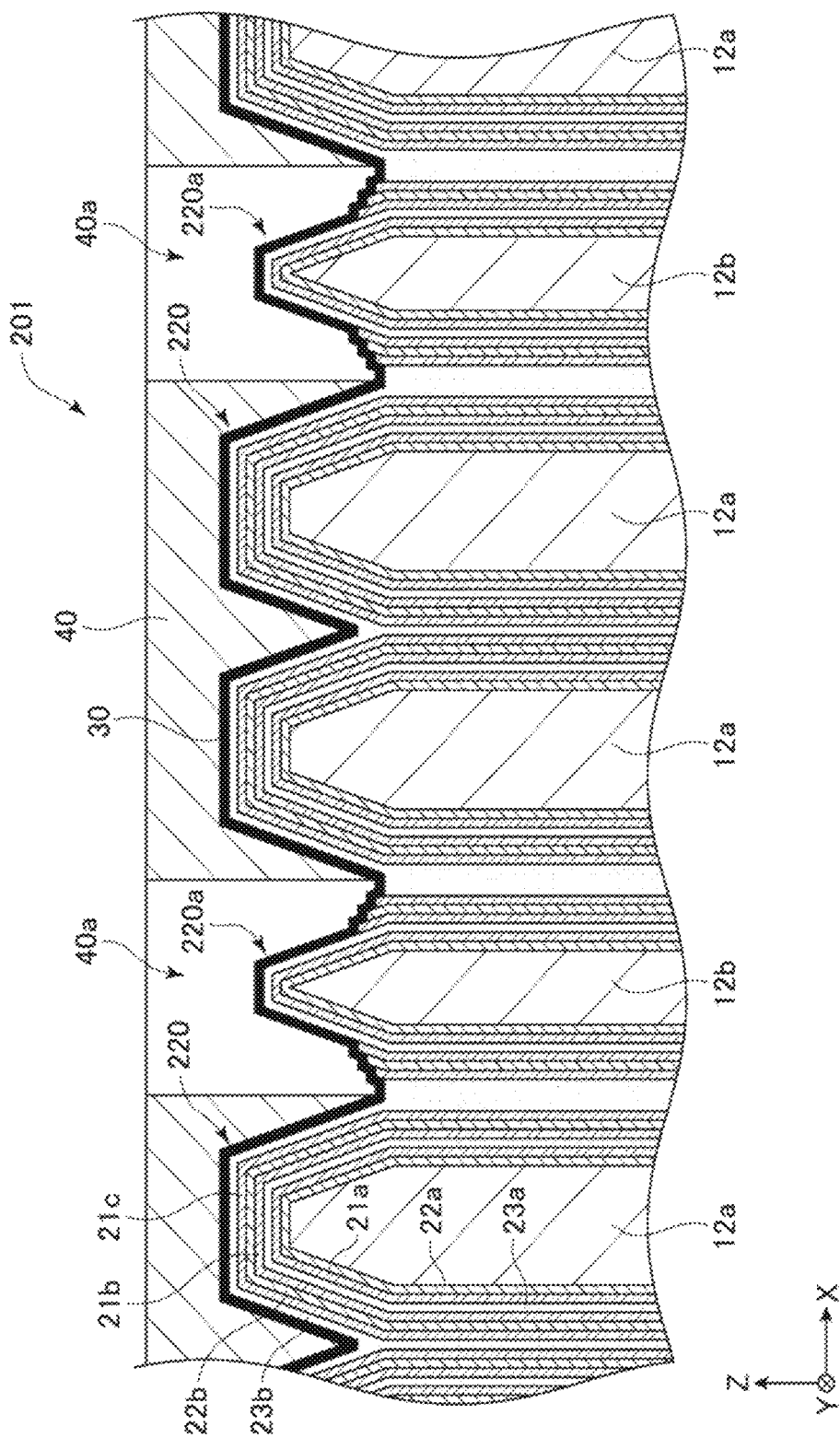
FIG. 14 is an enlarged sectional view schematically showing, in an XZ section of a trench capacitor according to another embodiment of the present invention, a vicinity of an upper surface of the trench capacitor.

Next, with reference to FIG. 14, a description is given of a trench capacitor 201 according to another embodiment. FIG. 14 is an enlarged sectional view schematically showing a vicinity of an upper surface of the trench capacitor 201. The trench capacitor 201 is different from the trench capacitor 1 in that an MIM structure 220 is provided in place of the MIM structure 20.

The MIM structure 220 includes a first negative internal electrode layer 22a, a first dielectric layer 21a provided on the first negative internal electrode layer 22a, a first positive internal electrode layer 23a provided on the first dielectric layer 21a, a second dielectric layer 21b provided on the first positive internal electrode layer 23a, a second negative internal electrode layer 22b provided on the second dielectric layer 21b, a third dielectric layer 21c provided on the second negative internal electrode layer 22b, and a second positive internal electrode layer 23b provided on the third dielectric layer 21c. In the MIM structure 220, as shown, in a region facing each of the through holes 40a (a region overlapping with each of the through holes 40a in plan view), a first MIM layer and a second MIM layer from the top have been removed. That is, the second positive internal electrode layer 23b, the third dielectric layer 21c, the second negative internal electrode layer 22b, and the second dielectric layer 21b of the MIM structure 220 have been removed in the region facing each of the through holes 40a. That is, the MIM structure 220 has a through hole 220a formed in a region overlapping with each of the through holes 40a in plan view (namely, each region overlapping with the narrow portion 12b1 in plan view), the through hole 220a penetrating through the second positive internal electrode layer 23b, the third dielectric layer 21c, the second negative internal electrode layer 22b, and the second dielectric layer 21b in the Z-axis direction.

As described above, in the MIM structure 220, one MIM layer composed of the first dielectric layer 21a, the first negative internal electrode layer 22a provided on a lower surface of the first dielectric layer 21a, and the first positive internal electrode layer 23a provided on an upper surface of the first dielectric layer 21a is provided in the region facing each of the through holes 40a, and three MIM layers are provided in a region other than the region facing each of the through holes 40a.

According to the foregoing embodiment, the distal end 55b1 of the narrow portion 12b1 provided in the wall 12b has an acute angle, and thus when a voltage is applied between the external electrode 2 and the external electrode 3, an electric field is more likely to be concentrated in a vicinity of the distal end 55b1 of the narrow portion 12b1 than in any other region in the MIM structure 20. Therefore, in the above-described trench capacitor 1, dielectric breakdown of the MIM structure 20 is likely to occur in the vicinity of the distal end 55b1 of the narrow portion 12b1. In other words, the trench capacitor 1 is designed so that dielectric breakdown of the MIM structure 20 occurs in the vicinity of the distal end 55b1 of the narrow portion 12b1.

Dielectric breakdown is likely to occur in a case where a high voltage is applied between the electrodes in the MIM structure 20. When dielectric breakdown of the MIM structure 20 occurs in the vicinity of the distal end 55b1 of the narrow portion 12b1, electric charge that has been charged flows in such a manner as to be concentrated in a dielectric breakdown occurring region. This causes a high-density current to flow in the dielectric breakdown occurring region in the MIM structure 20. Joule's heat is generated by this high-density current and melts part of the conductor layers and the dielectric layers, which are members constituting the MIM structure 20. When dielectric breakdown occurs in a deeper part of the trenches 11, the molten part of the conductor layers and the dielectric layers stays in a dielectric breakdown occurring region, resulting in occurrence of a failure in the short circuit mode. To avoid this, in the foregoing embodiment, dielectric breakdown is induced to occur in the vicinity of the distal end 55b1 of the narrow portion 12b1 of the wall 12b, so that a dielectric breakdown occurring region is a vicinity of an outer surface of the trench capacitor 1. Thus, molten part of the electrode layers and the dielectric layers melted by dielectric breakdown is likely to be discharged to the outside of the trench capacitor 1. As described above, according to the foregoing embodiment, molten part of the electrode layers and the dielectric layers melted by dielectric breakdown is likely to be discharged to outside a dielectric breakdown occurring region (for example, outside the trench capacitor 1), and thus the failure mode can be induced to be the open mode, the failure mode representing a failure caused by dielectric breakdown.

In the foregoing embodiment, the narrow portion 12b1 of the wall 12b is provided at a position not overlapping with either the external electrode 2 or the external electrode 3 in plan view. Thus, when dielectric breakdown has occurred in the vicinity of the distal end 55b1 of the narrow portion 12b1 in the MIM structure 20, molten part of the electrode layers melted by the dielectric breakdown can be prevented from adhering to the external electrode 2 or the external electrode 3. Thus, in the trench capacitor 1 according to the foregoing embodiment, the failure mode can be more reliably induced to be the open mode, the failure mode representing a failure caused by dielectric breakdown.

In the foregoing embodiment, the through holes 40a are formed through the protective layer 40 at each position overlapping with the narrow portion 12b1 of the wall 12b in plan view. Thus, when dielectric breakdown has occurred in the vicinity of the distal end 55b1 of the narrow portion 12b1 in the MIM structure 20, molten part of the electrode layers can be discharged through the through holes 40a to outside the trench capacitor 1. According to this embodiment, the failure mode can be more reliably induced to be the open mode, the failure mode representing a failure caused by dielectric breakdown. In one embodiment, an area occupied by the through holes 40a in plan view is 10% or less of an area of the protective layer 40 in plan view. By reducing a ratio of the area occupied by the through holes 40a to the area of the protective layer 40 as a whole, molten part of the electrode layers can be discharged to the outside without impairing an intrinsic function of the protective layer 40, which is a function of protecting the MIM structure 20 from external mechanical damage.

In the foregoing embodiment, at the distal end portion 14a of the wall 12a, an angle formed between the inclined surface 53a and the wall upper surface 55a and an angle formed between the inclined surface 54a and the wall upper surface 55a are each larger than 90°. In a conventional trench capacitor, walls partitioning trenches from each other are not chamfered, and thus, at a distal end of each of the walls, an angle formed between an upper surface of the distal end and a side surface of the distal end is approximately 90°. According to the forgoing embodiment, the distal end portion 14a of the wall 12a is chamfered. Consequently, an angle formed between the inclined surface 53a and the wall upper surface 55a and the angle formed between the inclined surface 54a and the wall upper surface 55a are each larger than 90°, so that an electric field is less likely to be concentrated on a distal end of the wall 12a than on a distal end of each of the walls in the conventional trench capacitor or on a distal end of the wall 12b. As a result, it is possible to suppress occurrence of dielectric breakdown at a location other than the distal end of the wall 12b. In other words, a dielectric breakdown occurring location can be more reliably restricted to a vicinity of the distal end of the narrow portion 12b1 of the wall 12b.

The dimensions, materials, and arrangements of the various constituent elements described herein are not limited to those explicitly described in the embodiments, and the various constituent elements can be modified to have any dimensions, materials, and arrangements within the scope of the present invention. Furthermore, constituent elements not explicitly described herein can also be added to the embodiments described, and it is also possible to omit some of the constituent elements described in the embodiments.

Herein, when it is explained that one object is provided "on," "on an upper surface of," "below," or "on a lower surface of" another object, the one object may be directly in contact with the another object or indirectly in contact with the another object via another layer or film. For example, in a case where the barrier layer 30 is provided on the MIM structure 20, the barrier layer 30 may be directly provided on the MIM structure 20 (so as to be in contact with the MIM structure 20) or indirectly provided on the MIM structure 20 via another layer.

What is claimed is:

1. A trench capacitor, comprising:
   a base member with an upper surface having a plurality of trenches provided therein; and
   an MIM structure provided on the base member so as to be embedded in the plurality of trenches,
   wherein the plurality of trenches include:
   a first trench; and
   a second trench adjacent to the first trench in a first direction orthogonal to a depth direction of the plurality of trenches,
   wherein the base member includes a first wall separating the first trench from the second trench such that the first trench is not connected to the second trench,
   wherein the first wall includes a first portion and a second portion, the first portion having an acute angle at a distal end thereof in a section including the first direction and the depth direction, the first portion being narrower than the second portion in the first direction,
   wherein the first portion of the first wall includes:
   a first inclined surface inclined at a first angle with respect to the depth direction; and a second inclined surface inclined at a second angle with respect to the depth direction, the second inclined surface being connected to the first inclined surface, and wherein the second portion of the first wall includes:
a third inclined surface inclined at the first angle with respect to the depth direction;
a fourth inclined surface inclined at the second angle with respect to the depth direction; and
a first wall upper surface connecting the third inclined surface to the fourth inclined surface.

2. The trench capacitor according to claim 1, wherein the first wall is formed so that the distal end of the first portion has a distal end curvature radius of 50 nm or less.

3. The trench capacitor according to claim 1, wherein the first wall is formed so that a distal end angle formed between the first inclined surface and the second inclined surface is 2° to 240°.

4. The trench capacitor according to claim 1, further comprising:
a protective layer provided on the MIM structure,
wherein the protective layer has a first through hole provided at a position overlapping with the first portion in plan view.

5. The trench capacitor according to claim 4, wherein the first through hole is formed at a position not overlapping with an external electrode in plan view.

6. The trench capacitor according to claim 1, wherein the MIM structure includes:
a first dielectric layer;
a first electrode layer provided on a lower surface of the first dielectric layer; and
a second electrode layer provided on an upper surface of the first dielectric layer.

7. The trench capacitor according to claim 6, wherein the MIM structure further includes:
a second dielectric layer provided on an upper surface of the second electrode layer; and
a third electrode layer provided on an upper surface of the second dielectric layer.

8. The trench capacitor according to claim 7, wherein each of the second dielectric layer and the third electrode layer has a second through hole provided at a position overlapping with the first portion in plan view.

9. The trench capacitor according to claim 1, further comprising:
a barrier layer provided between the MIM structure and the protective layer.

10. The trench capacitor according to claim 1, wherein the plurality of trenches further include:
a third trench; and
a fourth trench adjacent to the third trench in the first direction,
wherein the base member further includes a second wall separating the third trench from the fourth trench, and
wherein the second wall includes:
a fifth inclined surface inclined at a first angle with respect to the depth direction;
a sixth inclined surface inclined at a second angle with respect to the depth direction; and
a second wall upper surface connecting the fifth inclined surface to the sixth inclined surface.

11. A circuit board comprising the trench capacitor according to claim 1.

12. An electronic device comprising the circuit board according to claim 11.

13. The trench capacitor according to claim 1, wherein the plurality of trenches further include:
a third trench; and
a fourth trench adjacent to the third trench in the first direction,
wherein the base member further includes a second wall separating the third trench from the fourth trench, and
wherein the second wall includes:
a fifth inclined surface inclined at the first angle with respect to the depth direction;
a sixth inclined surface inclined at the second angle with respect to the depth direction; and
a second wall upper surface connecting the fifth inclined surface to the sixth inclined surface.

* * * * *